US008610002B2

(12) United States Patent
Lohman

(10) Patent No.: US 8,610,002 B2
(45) Date of Patent: Dec. 17, 2013

(54) COVER FOR ELECTRONIC EQUIPMENT

(75) Inventor: Bertil Lohman, Sollentuna (SE)

(73) Assignee: Clamco Invest AB, Sollentuna (SE)

( * ) Notice: Subject to any disclaimer, the term of this patent is extended or adjusted under 35 U.S.C. 154(b) by 27 days.

(21) Appl. No.: 13/503,375

(22) PCT Filed: Oct. 21, 2010

(86) PCT No.: PCT/SE2010/051139
§ 371 (c)(1),
(2), (4) Date: May 23, 2012

(87) PCT Pub. No.: WO2011/049525
PCT Pub. Date: Apr. 8, 2011

(65) Prior Publication Data
US 2012/0241210 A1    Sep. 27, 2012

(30) Foreign Application Priority Data
Oct. 23, 2009    (SE) ...................... 0950789

(51) Int. Cl.
*H01R 4/48*    (2006.01)
*H05K 5/00*    (2006.01)

(52) U.S. Cl.
USPC ........................... 174/368; 174/369; 174/384

(58) Field of Classification Search
USPC ........................... 174/368, 369, 384; 361/816
See application file for complete search history.

(56) References Cited

U.S. PATENT DOCUMENTS

| 4,507,520 | A | * | 3/1985 | Lindgren | 174/368 |
|---|---|---|---|---|---|
| 4,762,966 | A | * | 8/1988 | Kosanda | 174/369 |
| 4,788,381 | A | * | 11/1988 | Nilsson | 174/368 |
| 4,803,306 | A | * | 2/1989 | Malmquist | 174/351 |
| 4,929,802 | A | * | 5/1990 | Schaepers et al. | 174/368 |
| 5,008,486 | A | * | 4/1991 | Terakawa et al. | 174/368 |
| 6,140,577 | A | * | 10/2000 | Rapaich et al. | 174/365 |
| 6,252,159 | B1 | * | 6/2001 | Anagnos | 361/818 |
| 6,714,423 | B1 | * | 3/2004 | Nurmi | 361/818 |
| 6,963,495 | B1 | * | 11/2005 | Carullo et al. | 361/818 |
| 6,977,336 | B2 | * | 12/2005 | Enmoto et al. | 174/368 |
| 7,491,898 | B2 | * | 2/2009 | Villanella | 174/368 |
| 2002/0085363 | A1 | | 7/2002 | Mu-Tsai | |
| 2007/0153489 | A1 | | 7/2007 | Fan et al. | |
| 2009/0152000 | A1 | * | 6/2009 | Loughry et al. | 174/384 |

FOREIGN PATENT DOCUMENTS

DE    43 07 806 C1    4/1994
WO    2006/063169 A1    6/2006

OTHER PUBLICATIONS

International Search Report, dated Jan. 21, 2011, from corresponding PCT application.

* cited by examiner

*Primary Examiner* — Hung Ngo
(74) *Attorney, Agent, or Firm* — Young & Thompson

(57) ABSTRACT

Cover for electronic equipment including at least two movable metal panel elements. The panel elements are joined together along their respective edges, so they are joined together and in relation to each other immobile state form the cover. The invention is wherein the cover includes a respective connector for mechanical joining and good electric contacting along each one of the edges along which the panel elements are arranged to be joined together, in that each connector includes a respective resilient metal contacting device, which contacting device is arranged between the respectively joined together panel elements and in direct contact with both panel elements when the panel elements are in the joined together state, and thereby is compressed against the spring force of the contacting device, so that the spring force acts against the surfaces of both the respective joined together panel elements and connects them to each other electrically.

14 Claims, 25 Drawing Sheets

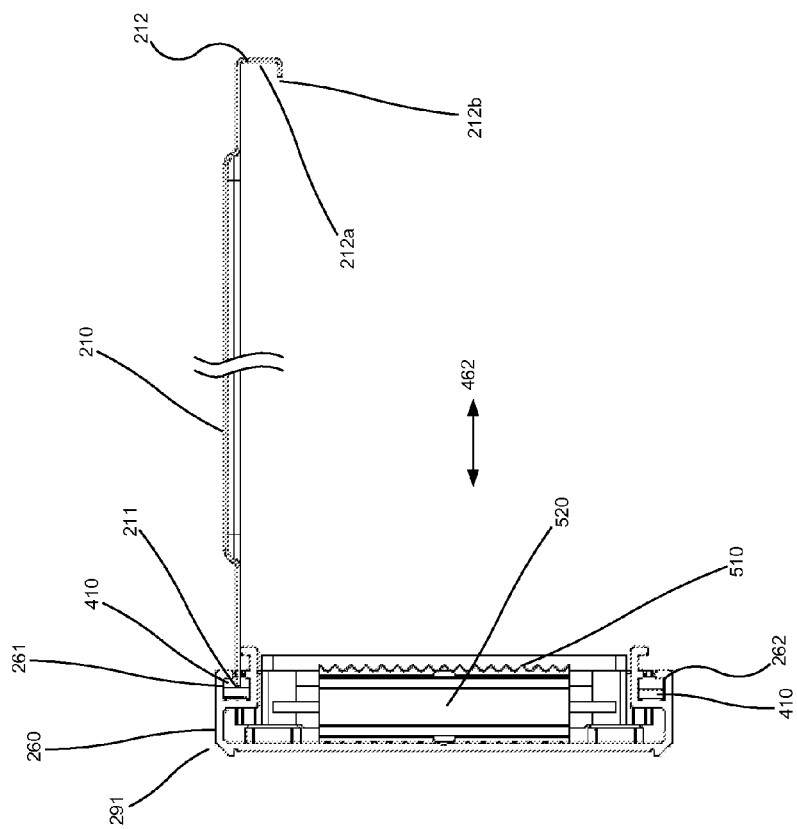
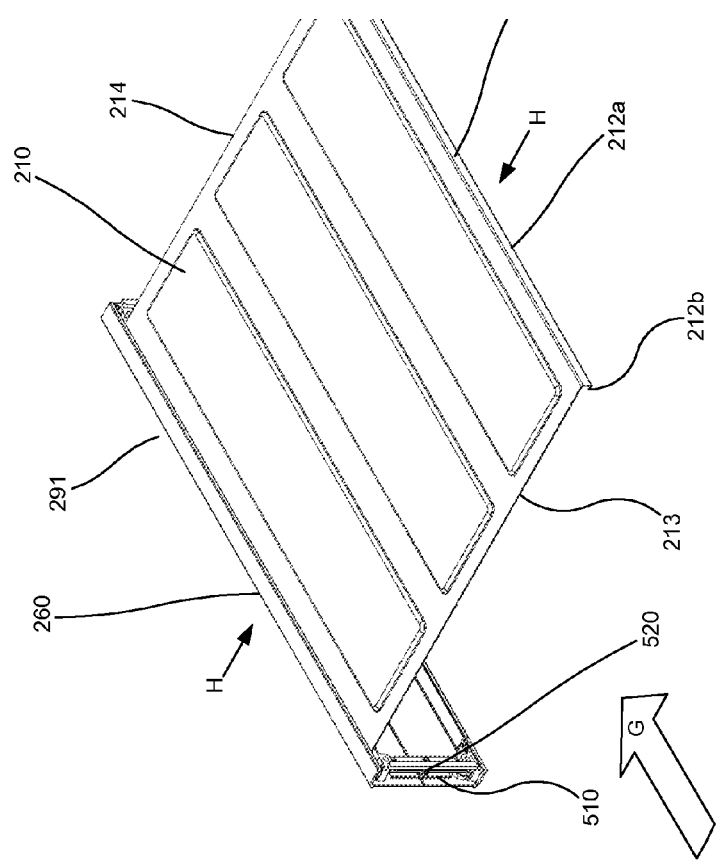
Fig. 6b
Fig. 6a

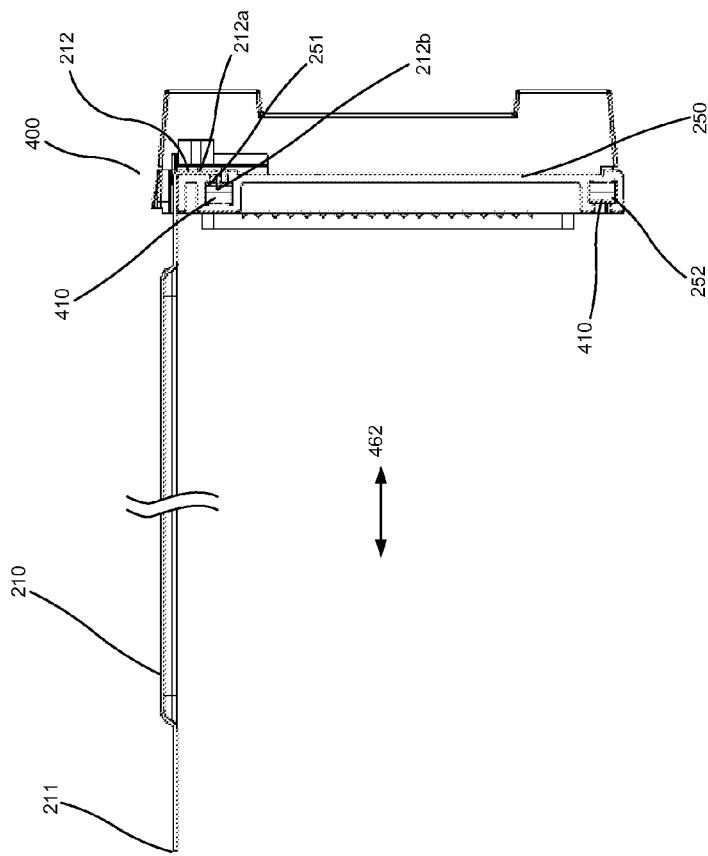
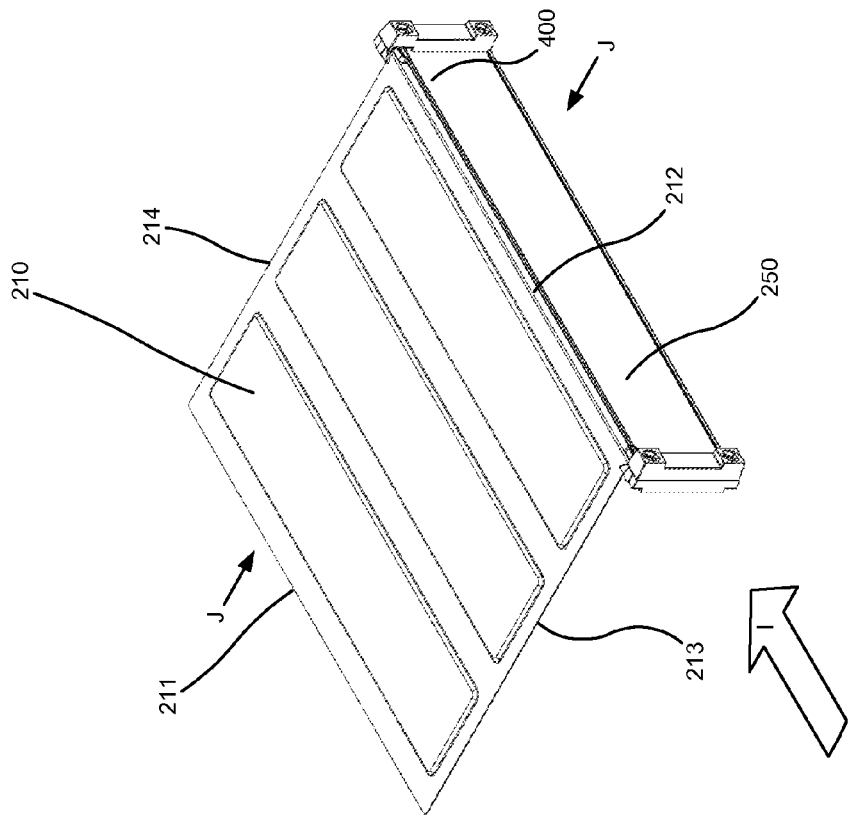

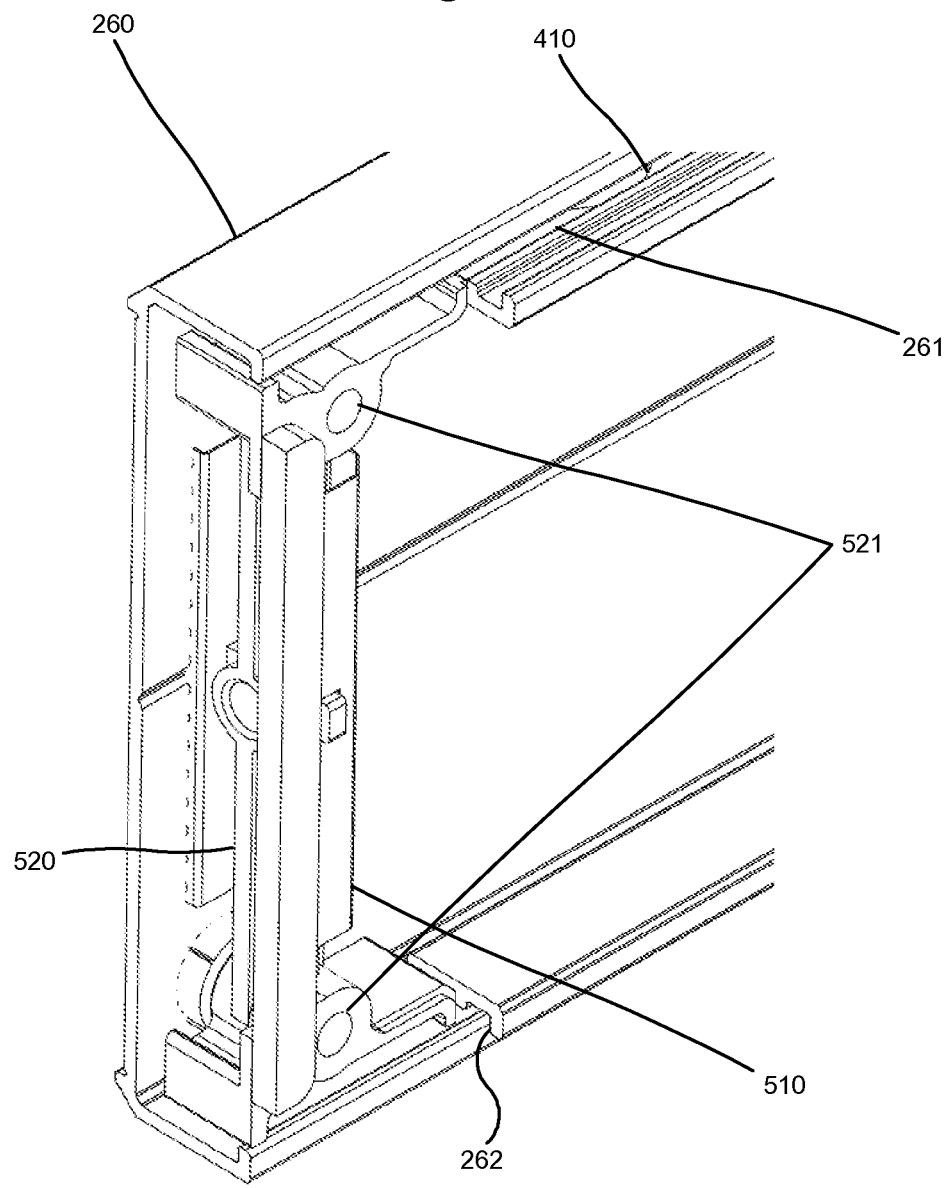

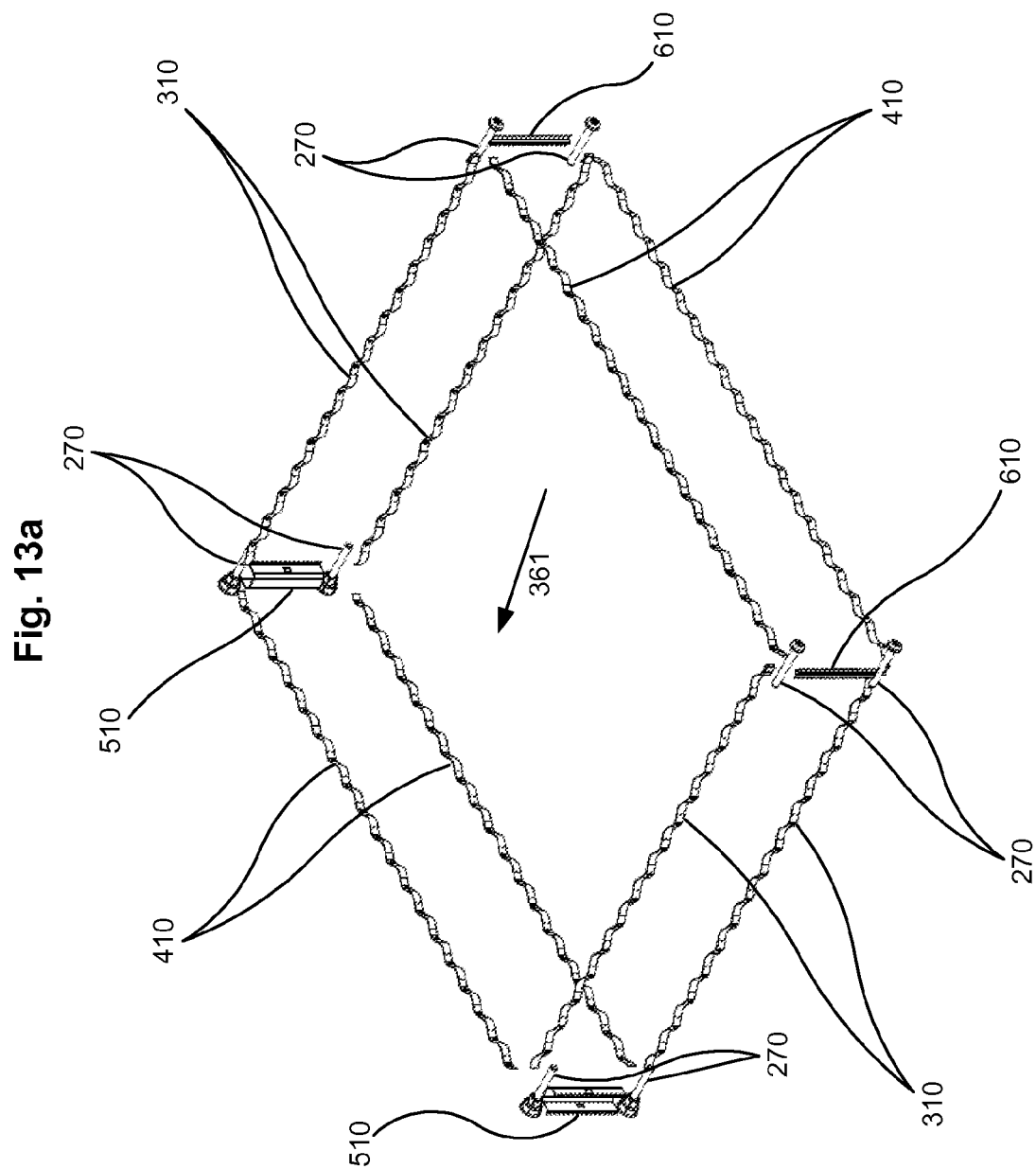

COVER FOR ELECTRONIC EQUIPMENT

The present invention relates to a cover for electronic equipment.

Typically, electronic equipment is arranged in the form of individual units, comprising a plurality of electronic components. Such components give rise to disturbing electromagnetic noise of various frequencies, which may interfere with other electronic components, even components arranged in other units.

Therefore, it is desirable that each such unit with electronic equipment is shielded electrically to avoid that such electromagnetic disturbance from other units interfere with the operation of the equipment, and to avoid that other units are negatively affected by disturbances from the equipment.

It is common for several units to be arranged near each other in stands. A commonly used form factor for such rack systems is the European 19 inch standard.

In order to keep the price down on such covers for electronic equipment, it is important that a solution to achieve good shielding is not too complicated. Since there are demands on the cover being able to quickly and securely be mounted and demounted, without risking the shielding properties. This is especially true in the case with industrially used electronic units, such as for example many units of 19 inch type, where there is a need for easy access to the interior of the cover, during installation of electronic components, etc.

Moreover, there are demands that the shielding should be effective over a constantly expanding frequency spectrum for electromagnetic disturbance.

In order to solve these problems, covers comprising a large number of bolted joints have previously been proposed in order to improve the electric contact between different parts of the cover.

The present invention solves the above described problems.

Thus, the invention relates to a cover for electronic equipment comprising at least two in relation to each other movable metal panel elements, wherein the panel elements are arranged to be joined together along respective edges of the panel elements, so that they in a joined together and in relation to each other immobile state form the cover, and is characterised in that the cover comprises a respective connector for mechanical joining and good electric contacting along each one of the edges along which the panel elements are arranged to be joined together, in that each connector comprises a respective resilient metal contacting device, which contacting device is arranged between the respectively joined together panel elements and in direct contact with both panel elements when the panel elements are in the joined together state, and thereby is compressed against the spring force of the contacting device, so that the spring force acts against the surfaces of both the respective joined together panel elements and connects them to each other electrically.

In the following, the invention will be described in detail, with reference to exemplifying embodiments of the invention and to the enclosed drawings, where:

FIG. 2b is an exploded perspective view of the cover of FIG. 2a;

FIG. 3d is a side view of the spring of FIG. 3a;

FIG. 5c is a side view of the spring of FIG. 5a;

FIG. 6a is a perspective view of a top panel and a front panel;

FIG. 6b is a side view of the top panel and the front panel of FIG. 6a as seen from G along a section H;

FIG. 7a is a perspective view of a top panel and a rear panel;

FIG. 7b is a side view of the top and rear panels of FIG. 7a as seen from I along a section J;

FIG. 10b is an exploded perspective diagram of the rear panel of FIG. 10a;

FIG. 11b is a detail perspective view of a part of the front panel of FIG. 11a;

FIG. 11c is an exploded perspective view of the front panel of FIG. 11a;

FIG. 12a is a cross-sectional top view of the cover of FIG. 2a;

FIG. 12b is a detail view of the cover of FIG. 12a;

FIG. 12d is a detail view of the cover of FIG. 12a;

FIG. 13a is a perspective view of a contacting system;

FIG. 13b is a first detail perspective view of the contacting system of FIG. 13a; and FIG. 13c is a second detail perspective view of the contacting system of FIG. 13a.

In all figures, the same reference numerals denote the same or corresponding parts.

Figure 1:
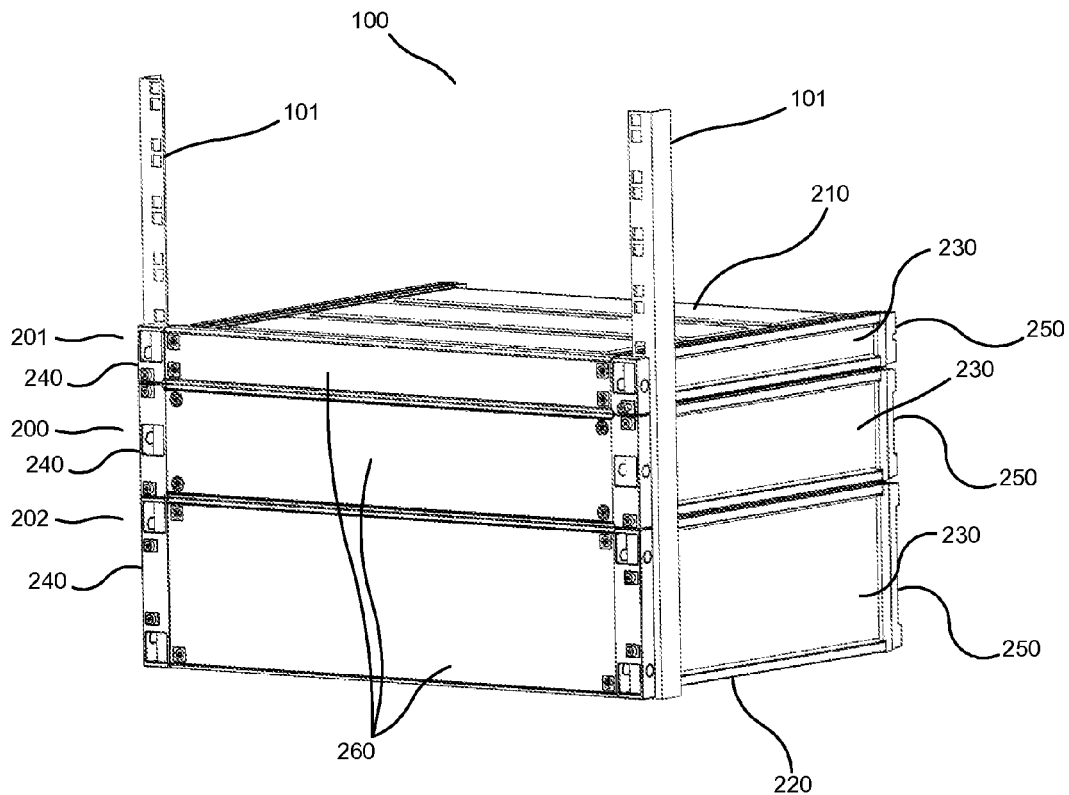
FIG. 1 is a perspective view of three different covers mounted in a rack of 19 inch type.

FIG. 1 shows a rack system 100 of 19 inch standard, comprising a stand 101 in which three covers 200, 201, 202 for electronic equipment are mounted.

Figure 2A:
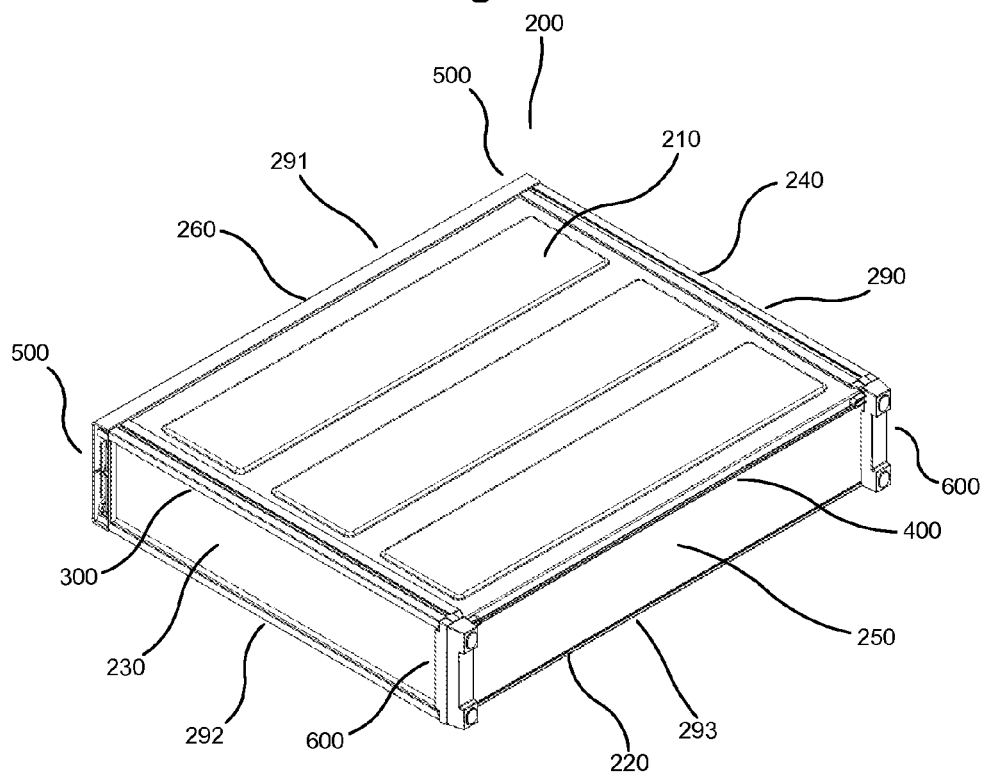
FIG. 2a is a perspective view of a cover.

The middle cover 200 is illustrated in closer detail in FIG. 2a. The cover 200, which is made of electrically conducting material, preferably metal, comprises a top panel 210, a bottom panel 220, a first side panel 230, a second side panel 240, a rear panel 250 and a front panel 260. Some, but not all, of the panels may be permanently fastened one to the other at the joints along which they meet. These panels may be made from a single metal piece, or be permanently joined together in any other way. At least a pair, preferably all, panels are however movable in relation to each other, and are arranged to be joinable, and therefore to be fixed and immobile in relation to each other, along with the said joints, using respective jointing means, for example comprising mounting screws.

The cover 200 assumes the shape illustrated in FIG. 1 when all panels which are movable in relation to each other are joined together in this manner.

It is preferred that the cover is shaped as a rectangular parallelepiped, in which each surface of the rectangular parallelepiped corresponds to a panel element which is jointed to the other panel elements, so that altogether six panel elements and twelve contactors are arranged in the cover. This results in uncomplicated jointing geometries and adequate contacting along all joints in the cover.

According to the invention, at least two panels, preferably all panels that are arranged pairwise adjacent to and mobile in relation to each other, are arranged to be joined together using a respective one such contactor, which is arranged to achieve both mechanical jointing a well as good electric contacting along each of the joints along which the respective panel elements are joined together.

In FIG. 2a, the following connectors are indicated:

Between on the one hand the top panel 210 and on the other hand the side panel 300, the rear panel 400, the second side panel 290 and the front panel 291, respectively;

between on the one hand the bottom panel 220 and on the other hand the first side panel 292 and the rear panel 293, respectively;

between respective side panels and the rear panel 600;

between respective side panels and the front panel 500.

In the present exemplary embodiment, the connectors between on the one hand the bottom panel 220 and on the other hand the front panel 260 and the both side panels 230, 240, respectively, are identical to the corresponding connector between on the one hand the top panel 210 and on the other hand the front panel 260 and the side panels 230, 240, respectively.

Figure 2B:
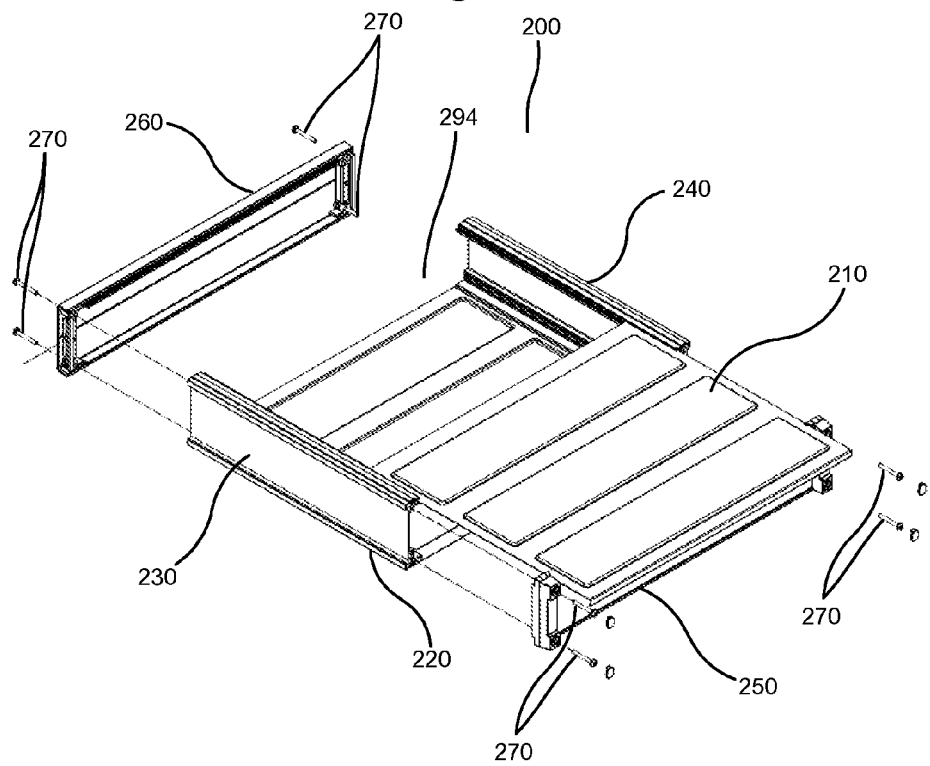
Figure 3A:
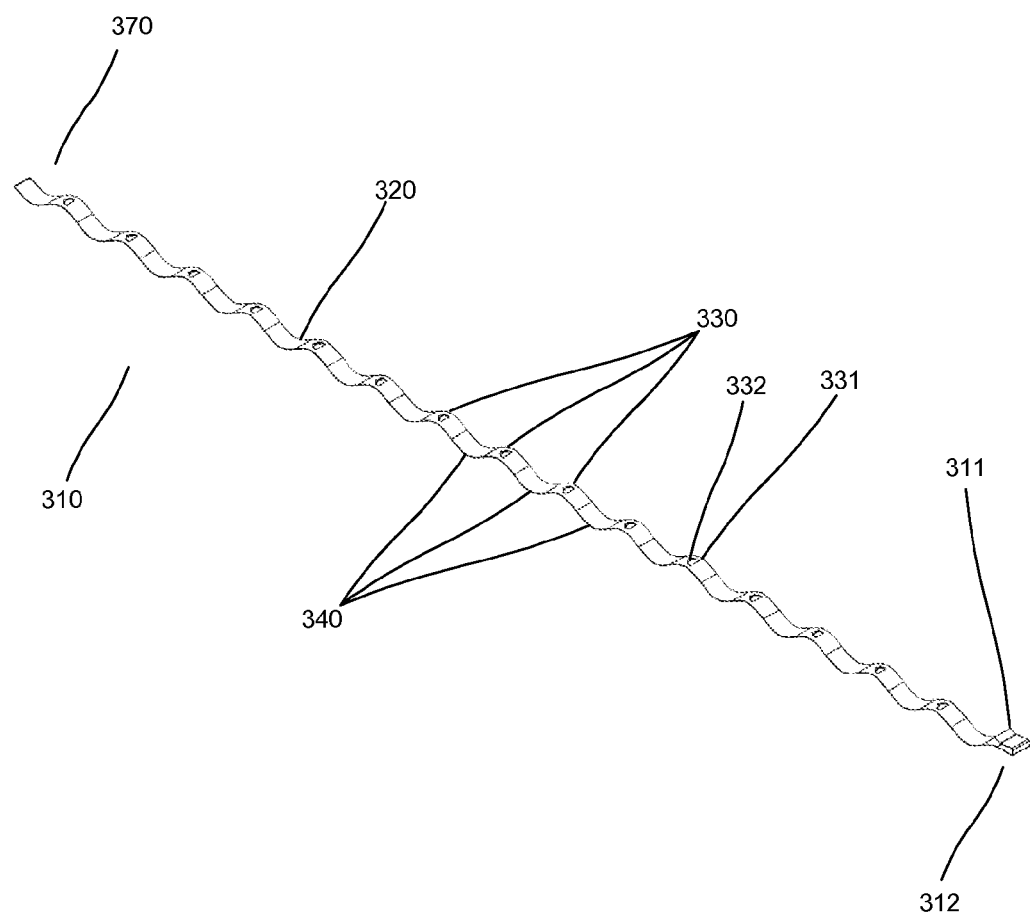
FIG. 3a is a perspective view of a first contacting device in the form of a spring.
Figure 3B:
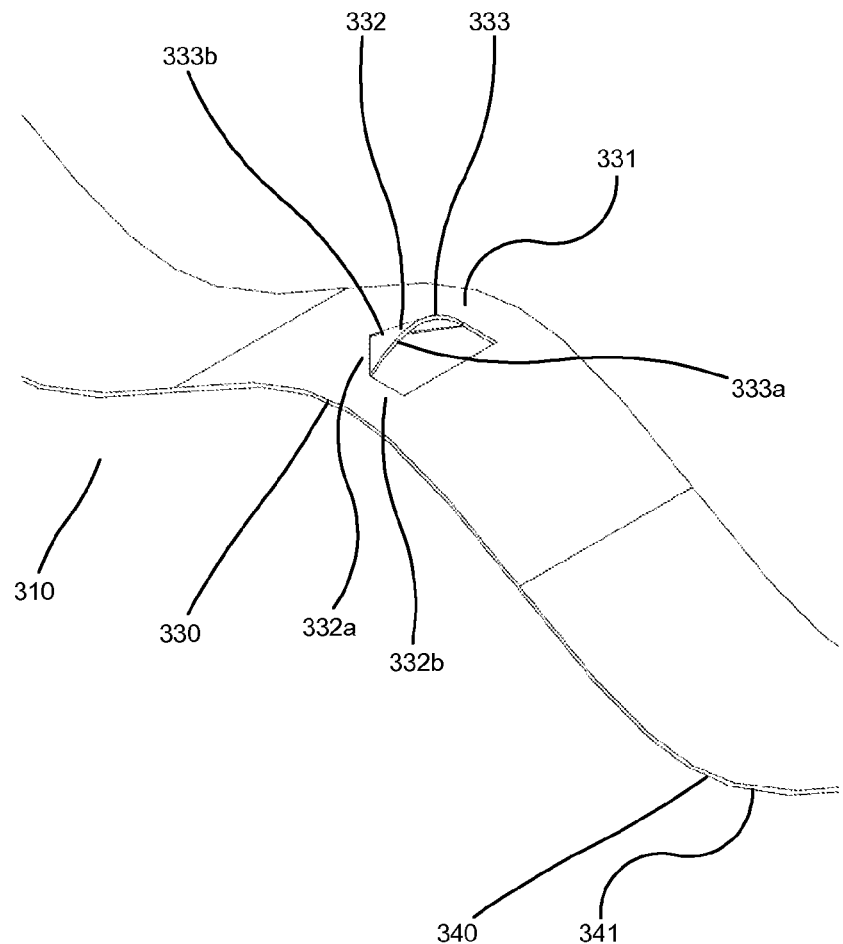
FIG. 3b is a detail view of a projection of the spring of FIG. 3a in perspective.
Figure 3C:
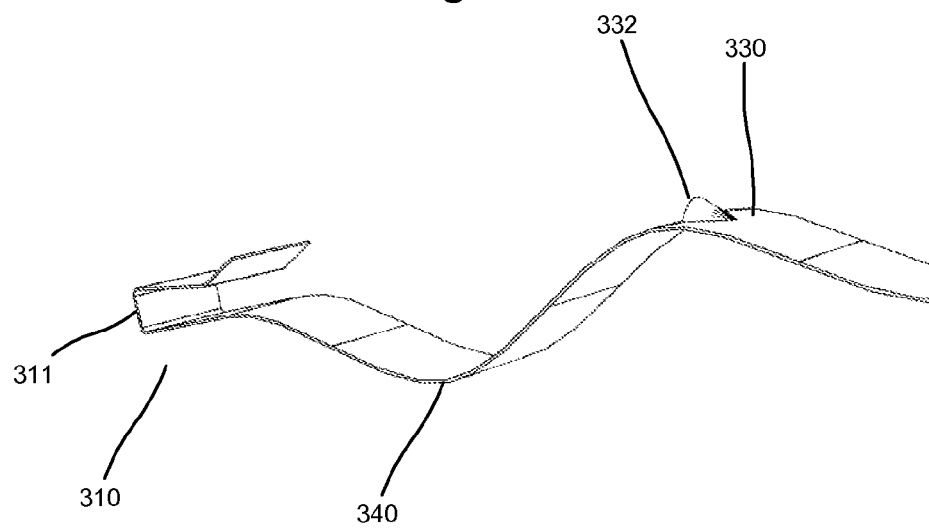
FIG. 3c is a detail view of a hook part of the spring of FIG. 3a in perspective.
Figure 3D:
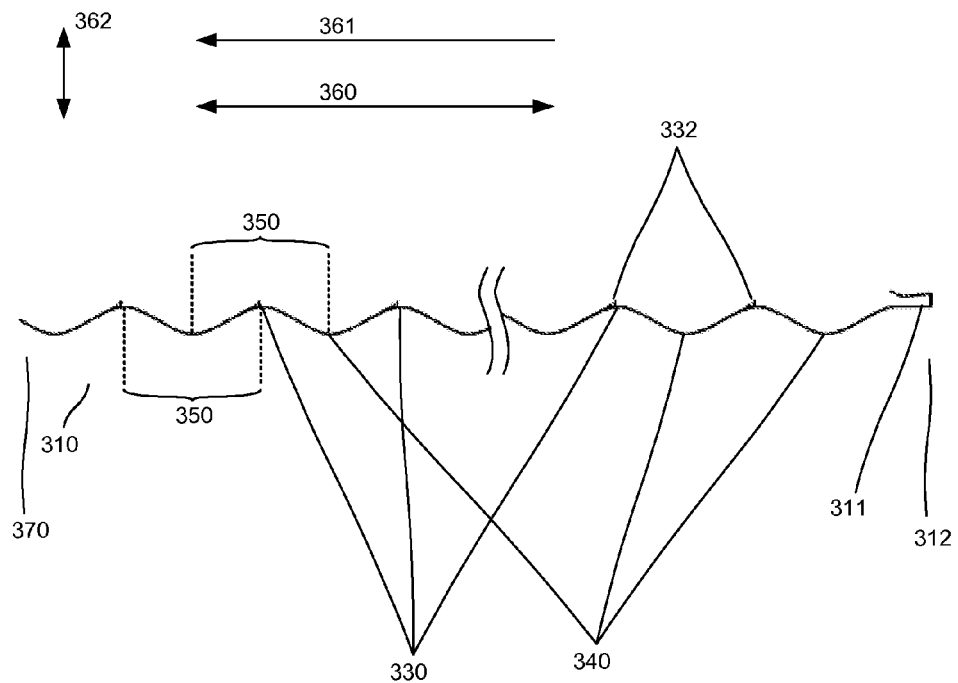
Figure 3E:
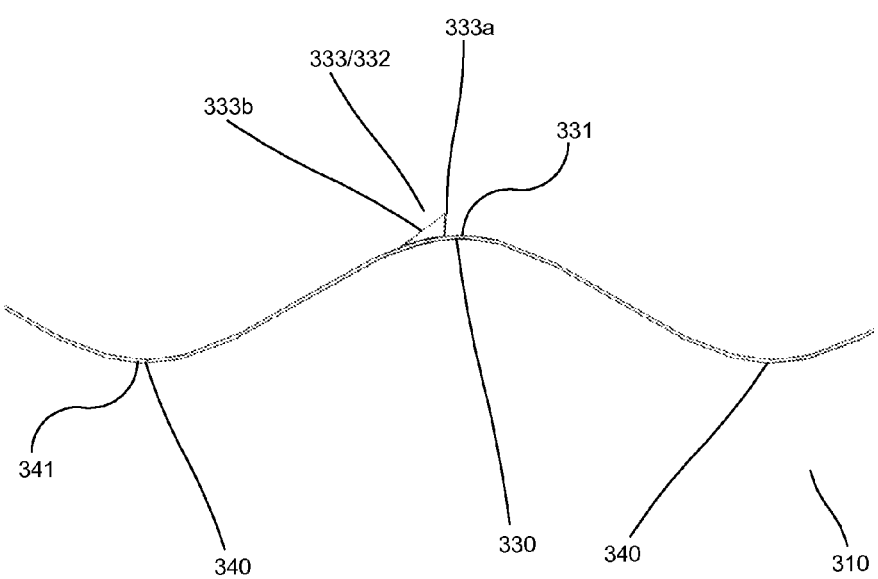
FIG. 3e is a detail side view of a part of the spring of FIG. 3d.

FIG. 2b illustrates the cover 200 in FIG. 2a partly exploded, where also fastening screws 270 for joining the respective panels together are shown.

According to the invention, each respective connector comprises a resilient contacting device in the form of an electrically conducting material, preferably metal, between panels that are movable in relation to each other. When two panel elements are joined together using such a connector, the contacting device is arranged between the respectively joined together panel elements and in direct contact with the respective side surface of both the respective panel elements. As will be described in detail in the following, in connection to the description of preferred embodiments, the resilient contacting device is designed so that it in this state is compressed against and overcoming its spring force, so that this spring force acts against the surfaces of both the respectively joined together panel elements, and connects them electrically one to the other. In other words, the contacting device is arranged to be pressed against both the joined together panels at the same time and thereby acting as a bridge between them, and the electric connection arises as a consequence of the contacting device, as well as the panels, being of metal material.

As will also be described in detail in the following, each contacting device is furthermore designed so that the contact surface which is present between the contacting device in question and each of the respective contacting panels is limited to a series of projections from the contacting device towards the respective panel when the panels are joined together using a connector comprising the contacting device.

According to a preferred embodiment, each contacting device furthermore comprises a metal spring part, which may be designed in different ways along different joints.

FIGS. 3a-3e illustrate a first exemplary embodiment of a contacting device comprising a hook spring device 310 comprising such a spring part 320, which is preferably used in connectors where the joining together is arranged to be executed by an edge of a first panel being pushed in parallel along one or two corresponding edges of one or two other panels, in order to be locked in its position when all panels are aligned. In the cover 200, there are such connectors arranged in the connectors 290, 292, 300 being arranged between on the one hand the top 210 and bottom 220 panels and on the other hand the first 230 and the second 240 respective side panel.

The spring part 320 is designed as an elongated, wave-shaped compression spring part, arranged to be positioned with its direction of elongation 360 oriented along the main direction of elongation of the connector along the joint between two adjacent panels. Preferably, the spring part 320 is in the form of a wave-shaped band, which comprises a plurality of alternating crests 330 and valleys 340 in the profile illustrated in FIG. 3d. It is preferred that the wave-shape is sinusoidal, so that the crests and valleys are evenly distributed and recur periodically along the whole length 360. The reference numeral 350 denotes the distance, in the direction of elongation, between two adjacent crests or valleys, respectively, when the spring part is sinusoidal.

The wave-shape results in that the spring part can be compressed against a spring force acting in a direction 362, perpendicular to the direction 360 of elongation. During such compression, the spring part will be extended in the direction of elongation, so that its ends 312, 370 are displaced away from each other.

Each crest comprises a respective outside 331, and each valley comprises a respective outside 341. When the spring part 320 is mounted in the connector, it is arranged to, against the spring force, be compressed, between the two respective panels that are joined together using the connector, in a press plane which is perpendicular to the wave-shape and therefore also to the direction 362 of the spring force. In other words, the spring part 320 is arranged to be mounted in the space between two respective surfaces of the joined together panels, and the respective outsides 331, 341 of the spring part then abut against, and are pressed against the spring force, against one respective panel surface each.

It is preferred that one 370 of the ends of the spring part 320 is free in relation to both the joined together panels, so that the spring part 320 can be flattened against the spring force under the pressure from the panels, and thereby be extended in a direction of movement 361 which is parallel to the direction of elongation 360.

Since the respective outsides 331 and 341 of all crests 330 and valleys 340 in this way are pressed towards the respective panel surfaces, a contact point between the spring part and a certain one of the two panels will result at each crest and valley, respectively. The electric contacting will be good, as a consequence of the small contact surface between spring part and panel surface in combination with the spring force pressing together spring and panel surface. Moreover, the electric contact will be mediated by the material of the spring part. By varying the period of the wave-shape of the spring part, high quality contact points with a certain predetermined maximum mutual interval can be achieved, so that the shielding of the cover with respect to electromagnetic disturbance becomes efficient across a certain predetermined frequency interval.

According to a preferred embodiment, the surface of the spring part on which the outsides 331 of the crests are arranged is provided with one or several projections 332. Such a projection is arranged at least at one, but preferably a plurality, most preferably all, crests 330, so that each projection 332 extends outwards from the outsides of the spring part crests along the spring force direction 362, and so that the distal end of each projection facing away from the spring surface 331 projects further out from the spring part than does the surface itself, without projections. In other words, the panel which is arranged to abut against the respective outsides 331 of the crests will abut against the respective exterior surfaces of the projection or projections 332, instead of the surface 331 when the spring part is mounted in the connector. The exterior surfaces of the projections are arranged with a smaller contact area against the panel surface than the contact area resulting in the case with no projections.

The projections 332 give rise to a large contact pressure between the spring part and the panel surface at the point of contact, which guarantees good electric contacting even in case dirt and the like exists on the respective surfaces.

The second end 312 of the spring part 320 is arranged with a hook part 311, arranged to grip around a corresponding edge on a panel along which the first panel is arranged to be slidable. When the hook 311 thus grips around the edge, the hook 311 cannot be displaced in the direction of movement 361 in relation to the surface of the panel having the edge. On the other hand, the free end 370 can still move in relation to the panel. Thus, the spring part 320, even if retained in relation to the surface of the panel with the hook at the place where the hook grips the edge, is movable in relation to the panel surface in the meaning that the free end of the spring part is movable, why the spring part can be flattened and thereby extended when compressed against its spring force. In this case, the extension takes place by the projections 332 sliding along the surface of the panel arranged with the edge as the spring part is compressed between the panel surfaces.

At the same time, the hook part 311 and the corresponding edge are preferably so formed so that the engagement when the hook grips around the edge admits movement of the spring part 320, and thereby the contacting device, in the direction which is opposite to the direction of movement 361.

It is preferred that the edge around which the hook part 311 is arranged to grip belongs to a panel which is arranged to abut against the projections 332 when the spring part 320 is mounted in the connector.

The contacting device 310 is preferably made in the form of one single, connected part, whereby the hook part 311 is a U-shaped portion in one end of the wave-shaped spring part 320.

Furthermore, it is preferred that at least one, rather a plurality, most preferably all, projections 332 are arranged to display relatively low sliding friction against the surface of the panel having the edge when the spring part 320 is slid against the latter in the direction of movement 361, and relatively high sliding friction when the spring part is slid against the panel surface in the opposite direction. Moreover, it is preferred that the relatively high sliding friction is higher than the sliding friction between the surface of the second panel and the side of the spring part facing towards this surface, that is the respective outsides 341 of the valleys 340, when the spring part 320 is compressed between the two panel surfaces.

The expression "relatively low sliding friction" and "relatively high sliding friction" herein refer to that the relatively low sliding friction is lower than the relatively high sliding friction when the spring part is mounted in its compressed state in the connector.

According to a preferred embodiment, at least one, rather a plurality, most preferably all, projections 332 are arranged in the form of a prickle, pressed out from the spring part 320 material, facing in a direction opposite to the direction of movement 361, and comprising a flange 333 with an inclined part 333b which is terminated in a sharp edge 333a. The design of the prickle is most clearly illustrated in FIGS. 3b, 3c and 3e, and comprises a side 332a with relatively low friction and a side 332b with relatively high friction. When the prickle is slid against the panel surface in the direction of movement 361, it will display relatively low friction, because of the sharp edge 333a facing in the opposite direction and since the inclined part 333b can be dragged along the panel surface. When, on the other hand, slid along the panel surface in the opposite direction, the sharp edge 333a will engage with the material of the panel surface, resulting in relatively high friction.

Such a design of the projections 332 will in a cost-efficient and reliable manner result in the desired friction properties during sliding in different directions. However, it is realized that the projections 332 can also be designed in other ways, as long as these friction properties are achieved.

A design of the spring part with the above described projections in combination with smooth outside 341 surface at the valleys 340 has proven to make possible that the friction during sliding of the outsides 341 of the valleys 340 against the panel having no edge is lower than the relatively higher friction, especially when the panel surface which is arranged to abut against the outsides 341 of the valleys is comprised by a narrow edge surface of the panel in question (see below).

Figure 4A:
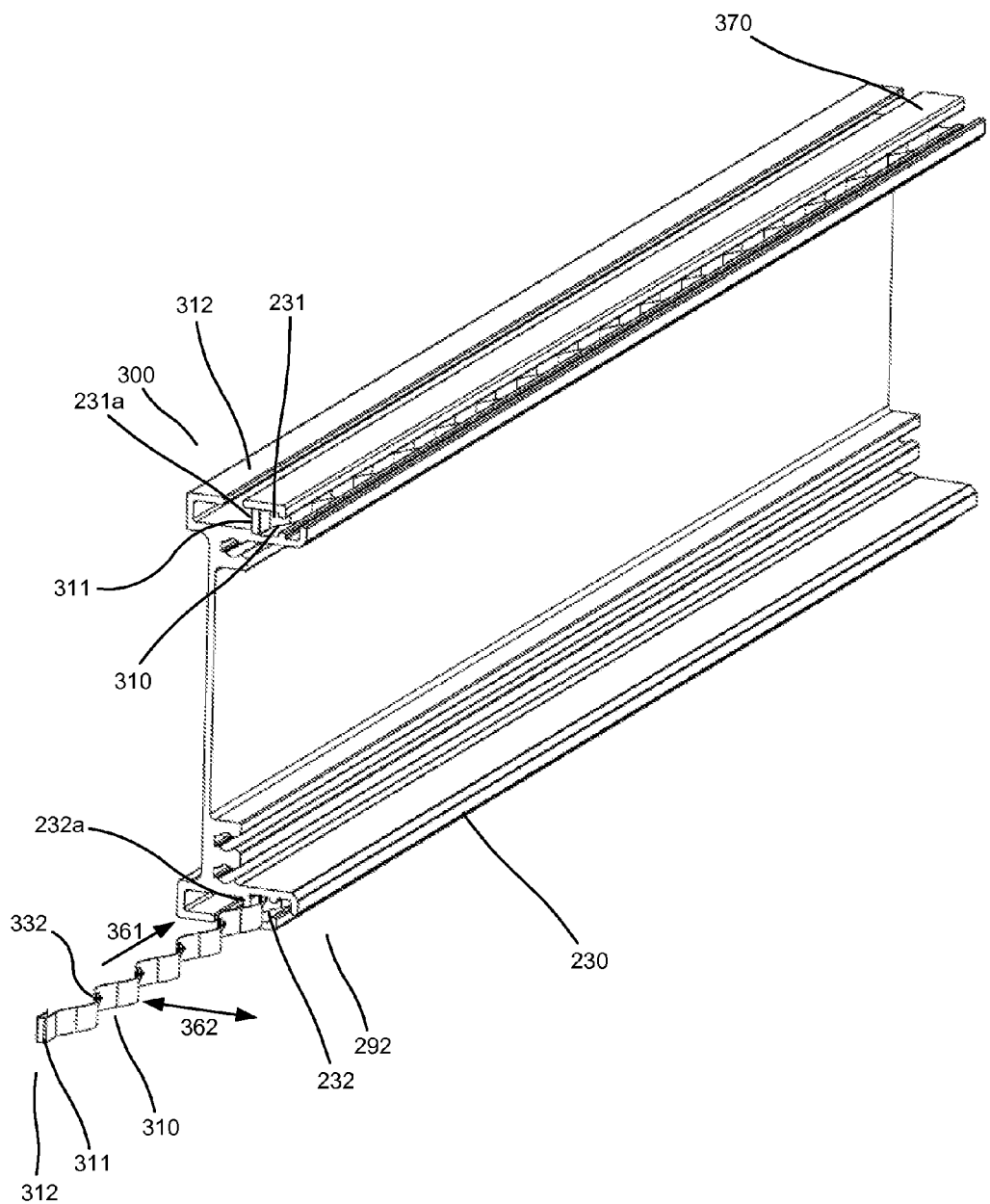
FIG. 4a is a perspective view of a side panel.

FIG. 4a illustrates the side panel 230. The panel 230 comprises elongated channels 231, 232, constituting respective grooves for side edges of top panel 210 and bottom panel 220. Thus, the channels constitute parts of the corresponding connector 300, 292 for joining together of the side panel 230 and the top panel 210 and bottom panel 220, respectively.

Channels 231, 232 are arranged to receive and accommodate one contacting device, in the form of a hook spring device 310 in accordance to the above said, each, so that the hook spring device runs along the channel in parallel to the main direction of elongation of the panel. Each channel is arranged with a respective edge 231a, 232a around which the hook 311 of the respective spring device can grip.

The channels 231, 232 are open in a direction towards the interior 294 of the cover 200 (see FIG. 2b). Into and in parallel with the respective channel, a respective elongated edge part of an adjacent panel is arranged to be insertable, together and in parallel with the hook spring device 310.

Figure 4B:
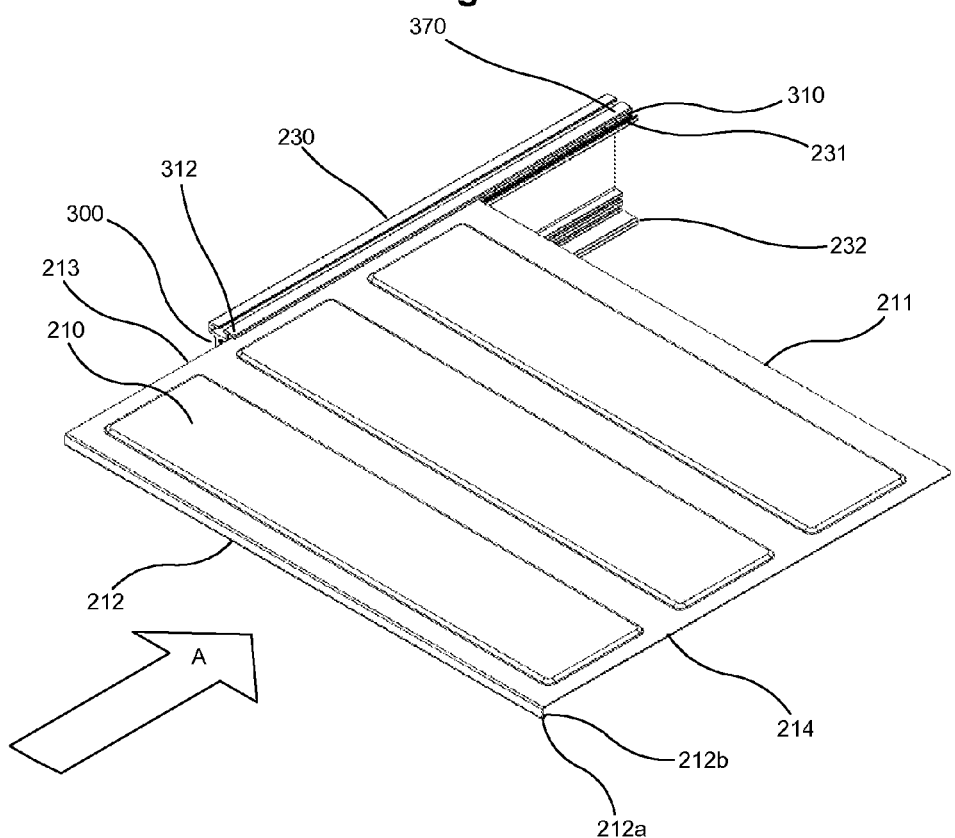
FIG. 4b is a perspective view of a side panel and a top panel.
Figure 4C:
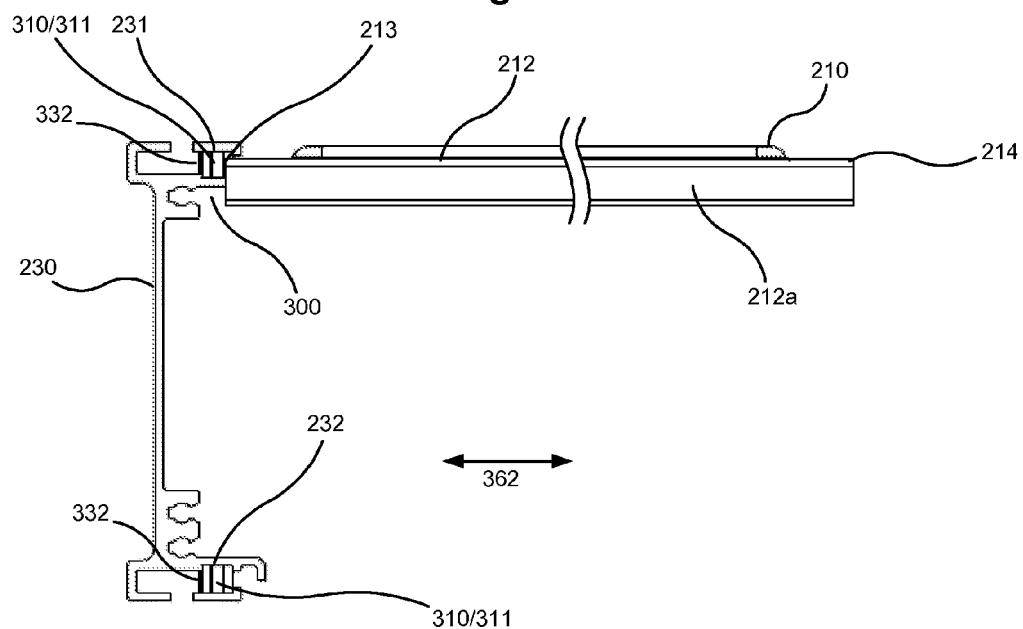
FIG. 4c is a side view of the side panel and the top panel of FIG. 4b as seen from A.
Figure 4D:
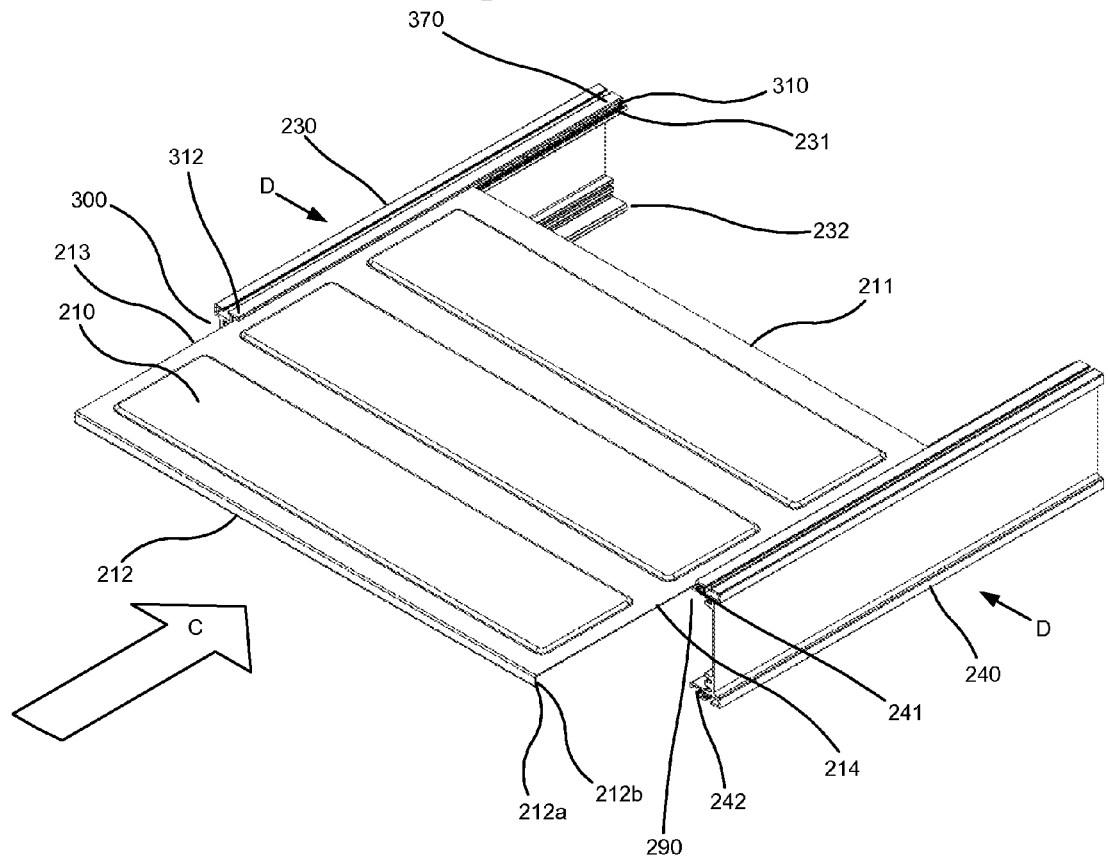
FIG. 4d is perspective view of two side panels and a top panel.
Figure 4E:
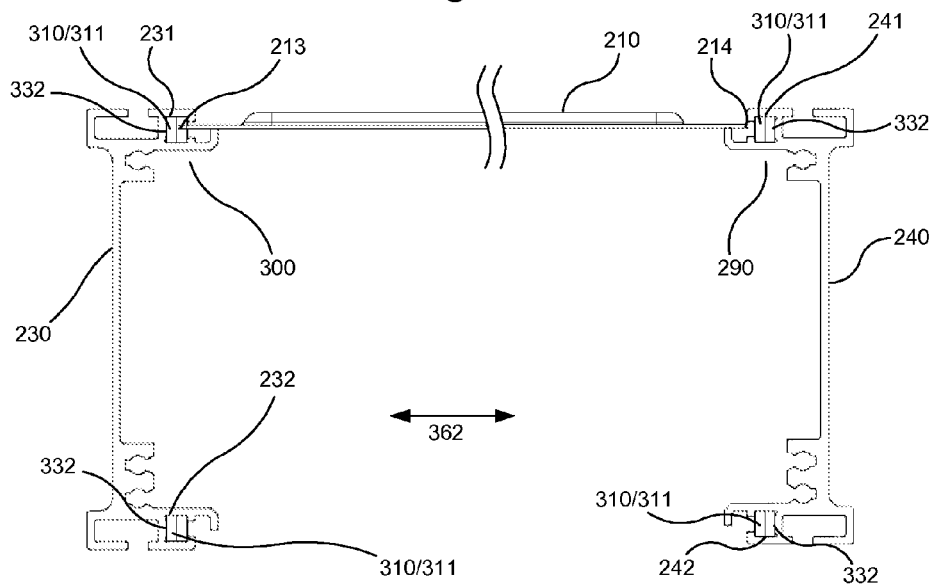
FIG. 4e is a cross-sectional view of the side panels and the top panel of FIG. 4d as seen from C along a section D.

This is illustrated in FIGS. 4b and 4c, wherein it is shown that the top panel 210 is arranged with a side edge 213 being insertable into the channel 231 together with the hook spring 310. In FIGS. 4d and 4e, the corresponding configuration is shown, but now with both side panels 230 and 240, comprising two channels each 231, 232, 241, 242 for engagement with top and bottom panels. The side panels are illustrated in engagement with one elongated edge 213, 214 of the top panel 210 each. The side panels are arranged in parallel with each other, to admit sliding of the top plate between the side panels.

As is most clearly shown in FIG. 4e, the connectors 290, 300 are arranged to mechanically join together the pairs of panels 230, 310 and 240, 210, respectively, when the respective side edges 213, 214 of the top panel are inserted into the respective channel 231, 241. The mechanical joining together can be completed by engagement between the panels 210, 230, 240 and other, in FIGS. 4c-4e not shown panels.

When the respective side edge 213, 214 is inserted into the respective channel 231, 241 together with the spring part 320, the respective outsides 331 of the spring part crests 330, in other words the respective exterior surface of the projections 332, are arranged to abut against an inner surface of the channel, which inner surface is arranged at a distance from the side edge when the latter is mounted in the channel. At the same time, the respective outsides 341 of the spring part valleys 340 are arranged to abut against the side edge 213, 214. The dimensions of the constituting parts 210, 213, 214, 231, 241, 310, 332 are selected so that the spring part 320 against is flattened its spring force during the insertion of the elongated side edge part into the channel.

Hence, during assembling of the top panel, a respective contacting device in the form of a hook spring 310 is firstly inserted in each of the channels 231, 241, so that their respective hook 311 grips around a respective edge 231a. Thereafter, the top panel 210 is inserted in the direction 361 of motion of the hook springs (see FIG. 4a), in between the side panels 230, 240, so that the side edges 213, 214 of the top panel are inserted into and along the respective channels 231, 241 together with a respective hook spring 310 each. As the motion in the direction of motion 361 of each hook spring is limited by its hook part, the hook spring is not carried along by the side edge of the top panel. Instead, it is pressed outwards from the respective side edge 213, 214, towards the inside of the channel and against the direction 362 of the spring force, so that the side edge is pressed against the inside of the channel.

This will the result in the hook spring being extended by its free end 370 being displaced in the direction of elongation 361. This displacement takes place without problems, since the friction between the projections 332 and the inside of the channel is low in the direction of motion.

Figure 4F:
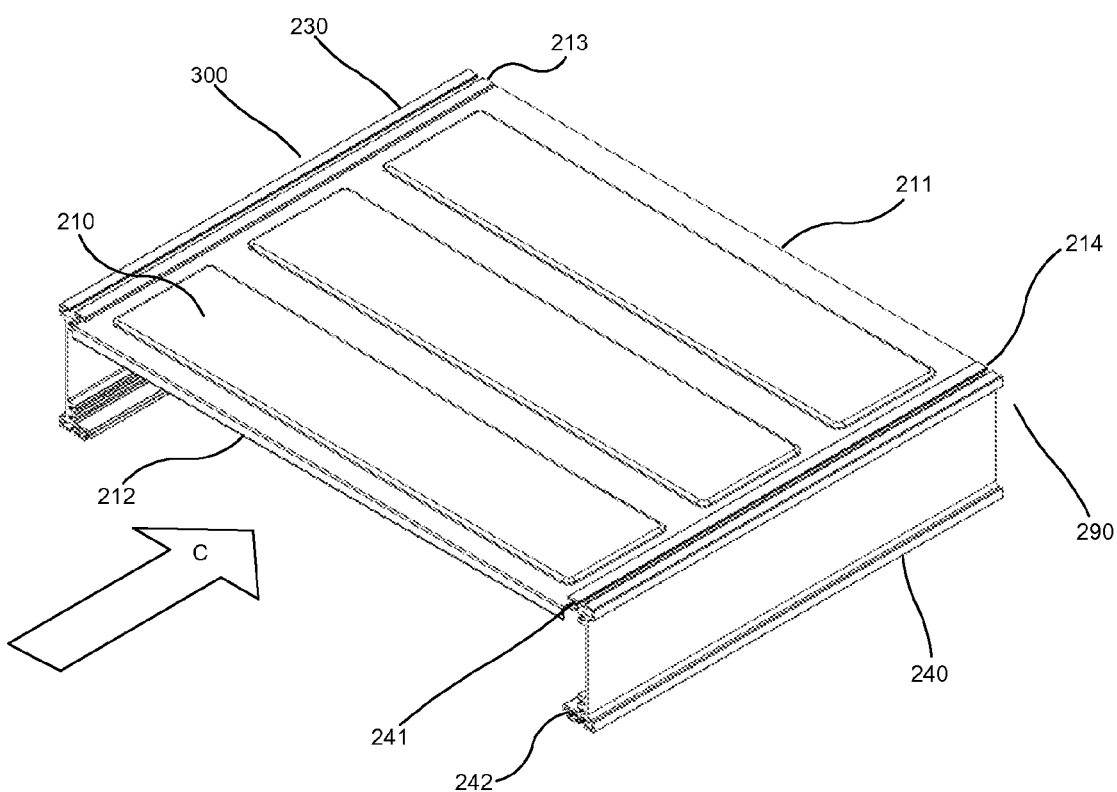
FIG. 4f is a perspective view of two side panels and a top panel.
Figure 5A:
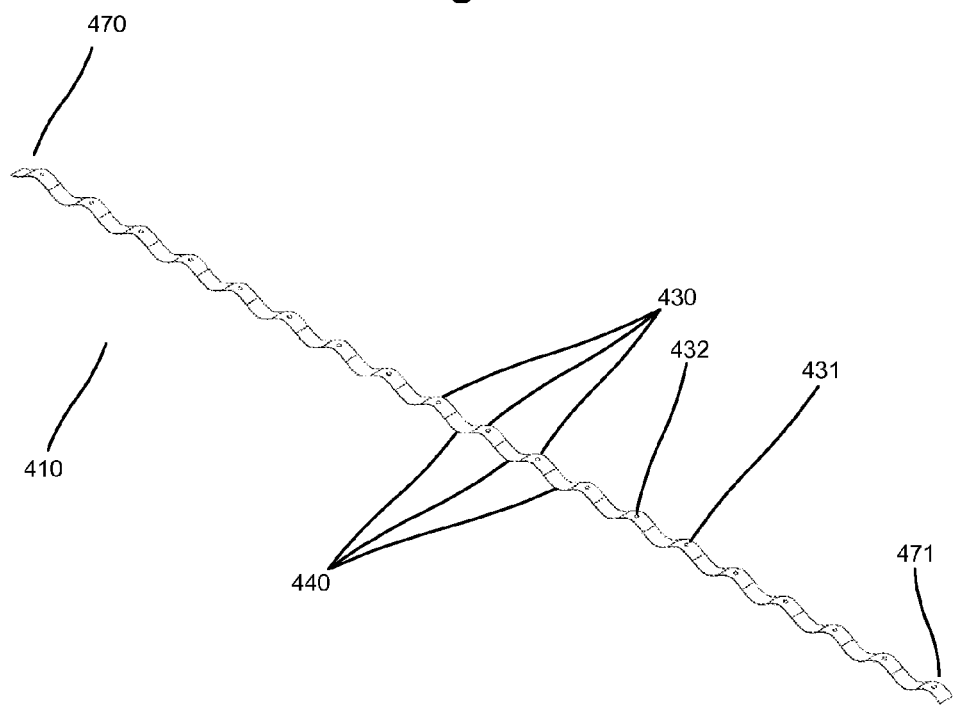
FIG. 5a is a perspective view of a second contacting device in the form of a spring.
Figure 5B:
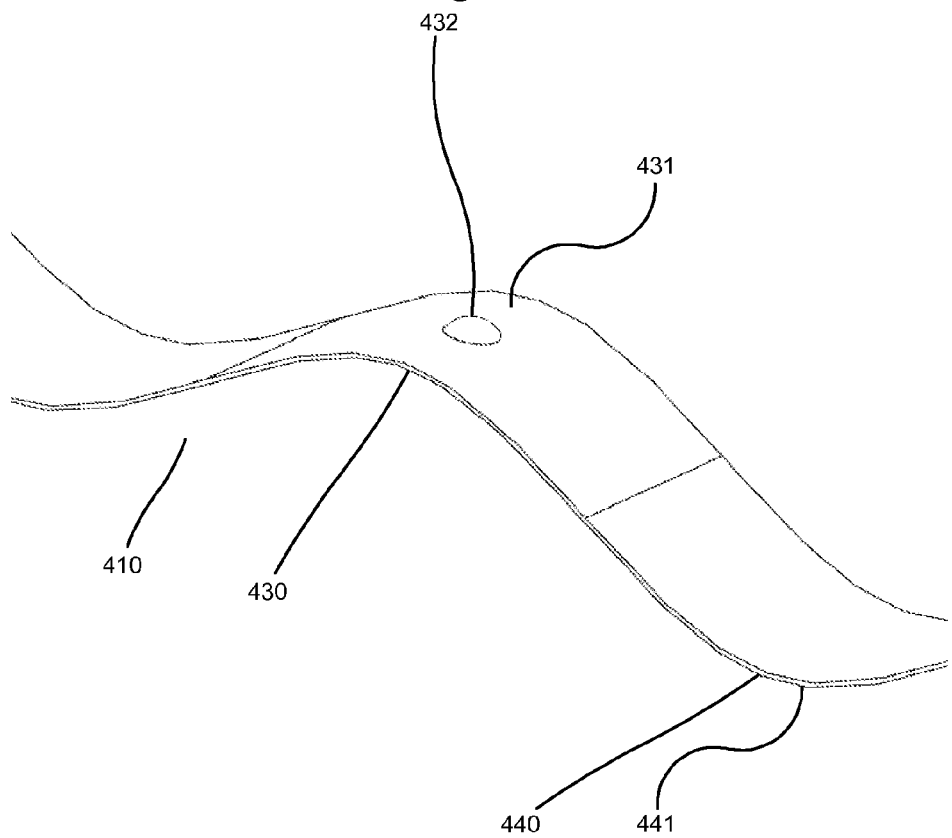
FIG. 5b is a detail view of a projection of the spring of FIG. 5a in perspective.
Figure 5C:
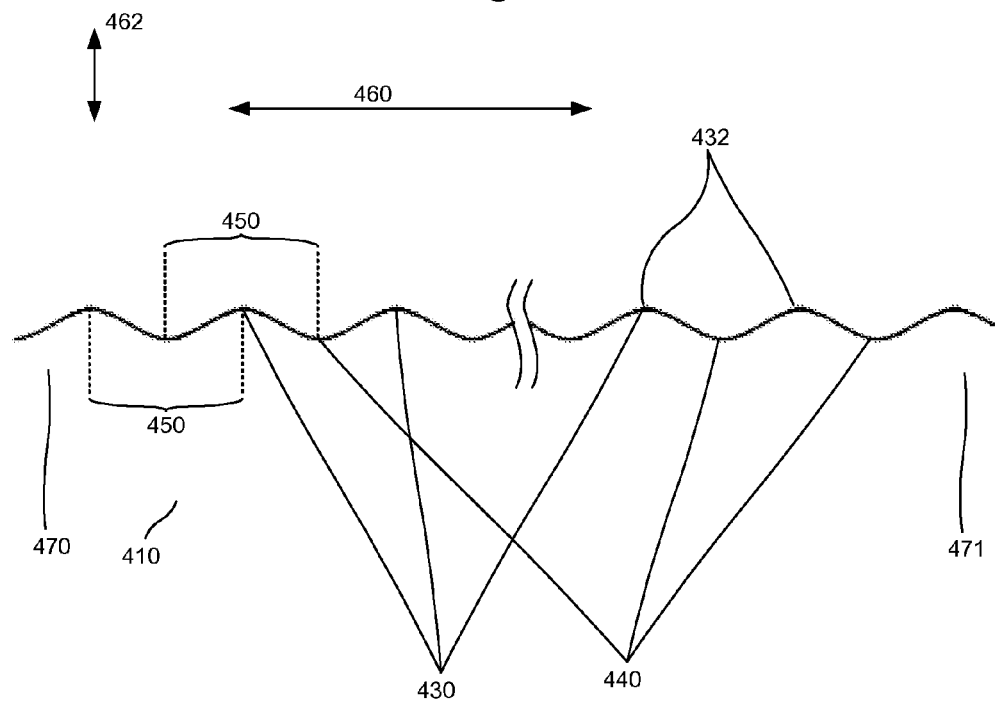
Figure 5D:
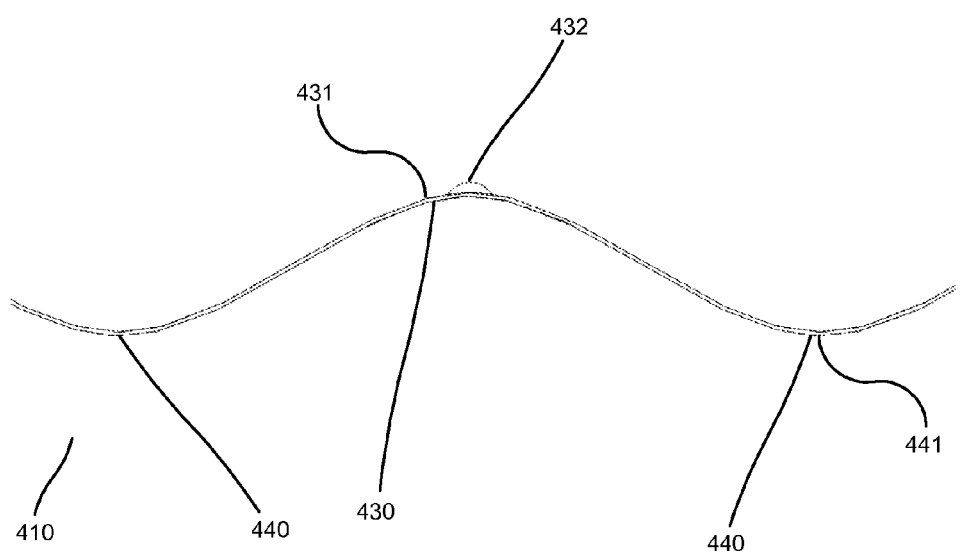
FIG. 5d is a detail side view of a part of the spring of FIG. 5c.

Finally, the fully pushed in position of the top panel 210 which is illustrated in FIG. 4f is achieved. In this position, the top panel may be fixed using fixing means (not shown in FIG. 4f).

When the top panel 210 is again pulled out, the friction between the projections 332 and the inside of the respective channel 231, 241 will be higher than during the pushing in step, see above. Since the friction between the outsides 341 of the respective spring part 320 valleys 340 and the side edge 213, 214 of the respective top panel 310 is lower than the friction between the projections and the inside of the respective channel during motion of the hook spring 310 against the direction of motion 361, the spring will be retained in its position in the channel, except that the part of the spring comprising its free end 370, which is no longer loaded, will be pulled together and become shorter, why the free end to a certain extent will move in the direction of motion 361. This can take place without risking that the spring is compressed to lock the top panel. When the top panel is then completely pulled out, the hook springs hence remain in the same location as before the top panel was first pushed in. In this position, they can easily be removed from their respective channel by simply pulling them out by the hook 311.

Since the pointed projection 332 of the hook spring 310 abuts, under the spring force and with a small contact surface, against the inside of the channel 231, 241, good electric contacting between side panels 320, 240 and hook spring is achieved. At the same time, the outside of the hook spring valleys abut against, under spring force, the side edge 213, 214 of the top panel 210, which side edge is preferably narrow, whereby a small contact surface is also created between hook spring and top panel. This leads to the total spring force per spring crest against the top panel edge is focused onto a small surface, which generates maximum surface pressure, why a secure electric contacting with corresponding good electric contacting is achieved. Thus, there is good contacting between the side panels and the top panel. Furthermore, the points of contact are distributed at predetermined maximum distances, preferably at even distances, along the both respective connectors 290, 300, which gives good and well-controlled shielding properties.

It is preferred that the top panel 210 is shaped as a sheet, the side edge or edges 213, 214 of which is or are essentially thinner than the width in the compression plane of the hook spring 310.

The construction of the bottom panel 220 can advantageously be similar to the one of the top panel 210.

FIGS. 5a-5d illustrate a second exemplifying embodiment of a contacting device comprising a spring part 410, which is preferably used in connectors where the joining together is arranged to be executed by an edge of a first panel being pushed up to and pressed against an edge of a second panel, in a direction which is perpendicular to the plane of the second panel, and to be locked into its position there, and where the two edges are not both short ends of the respective panel. In the cover 200, there are such connectors 291, 293, 400 arranged between on the one hand the top 210 and bottom 220 panels, respectively, and on the other hand the rear 250 and front 260 panels, respectively.

The spring part 410 is, as regards its general structure, similar to the spring part 320 described above, and comprises crests 430 on the outsides 431 of which are arranged projections 432; valleys 440 with respective outsides 441; smallest distances between crests and valleys 450; and is associated with a direction of elongation 460 and a thereto perpendicular direction 462 of the spring force.

As opposed to the hook spring 310, the spring part 410 however lacks a hook, and at least one, preferably both ends 470, 471 of spring part 410 are free in relation to both of the panels joined together by the connector, so that the spring part 410 can be flattened against the spring force under the pressure from the panels and thereby be extended in both directions.

As is the case with the spring part 320, the spring part 410 is arranged with projections 432 with a small contact surface. Such projections are arranged at the respective outside 431 of at least one, rather a plurality, most preferably all, of the crests 430. As described above, the projections guarantee adequate electric contacting against a panel surface which is pressed against the projections. As opposed to the spring part 320, the projections are however not designed with different sliding friction in different directions of motion.

Instead, the projections 432 are preferably shaped as part spheres. Such a configuration results in the sliding friction between the spring part and the panel surface abutting against the projections being comparatively low, despite the large contact pressure, and as a consequence thereof that the spring part 410 can slide against the panel surface when it is flattened out against the spring force and extended, which facilitates assembly and guarantees that the contact points are positioned at a predetermined distance from each other.

It is realized that other projection configurations are also possible, as long as they allow a low sliding friction along the direction of elongation 460 in both directions, in combination with a small contact area during pressing against a panel surface.

FIGS. 6a and 6b show the connector 291 between top panel 210 and front panel 260. The top panel is shown in the position which is illustrated in FIG. 4f, in which the top panel is completely pushed in between side panels 230, 240 (not shown in FIG. 6a). In this position, the front edge 211 of the top panel has been inserted into a groove 261 of the front panel arranged at the upper end of the front panel. Before the top panel is inserted into the groove, which is open in a direction towards the top panel when the cover 200 is assembled, a contacting device in the form of a spring 410 without hook according to the above has been inserted into, and in parallel with, the groove. As the front edge of the top panel is inserted into the groove perpendicularly to the direction of elongation of the groove, the edge is thereby pressed against the spring part in a direction 462 against the spring force of the spring part.

Thereby, the spring part 410 is compressed, and its projections 432 are pressed against an inner surface of the groove of the front panel 260 arranged away from the top panel 210, at the same time as the respective outsides 441 of the spring part valleys 440 are pressed against the front edge 211 of the top plate. Thus, adequate electric contacting is achieved at each contact surface between projection and inner surface, and outside and edge, respectively, because of a small contact surface and pressure from the spring force. Since the spring part is arranged with alternating crests and valleys, it is possible to control the shielding properties, in a way which is analogue to the one described in connection to the hook spring 310, by varying the wave period of the wave-shaped spring part and thereby the distance between two consecutive contact points between panel and spring.

It is preferred that the front edge 211 of the top panel 210 is narrow as compared to the width of the spring part 410 in the press plane, in order to achieve a small contact surface.

FIGS. 7a-7d show the connector 400 between top panel 210 and rear panel 250, where the top panel 210 is in the same position in relation to the rear panel 250 as in FIGS. 4f, 6a and 6b.

Figure 7C:
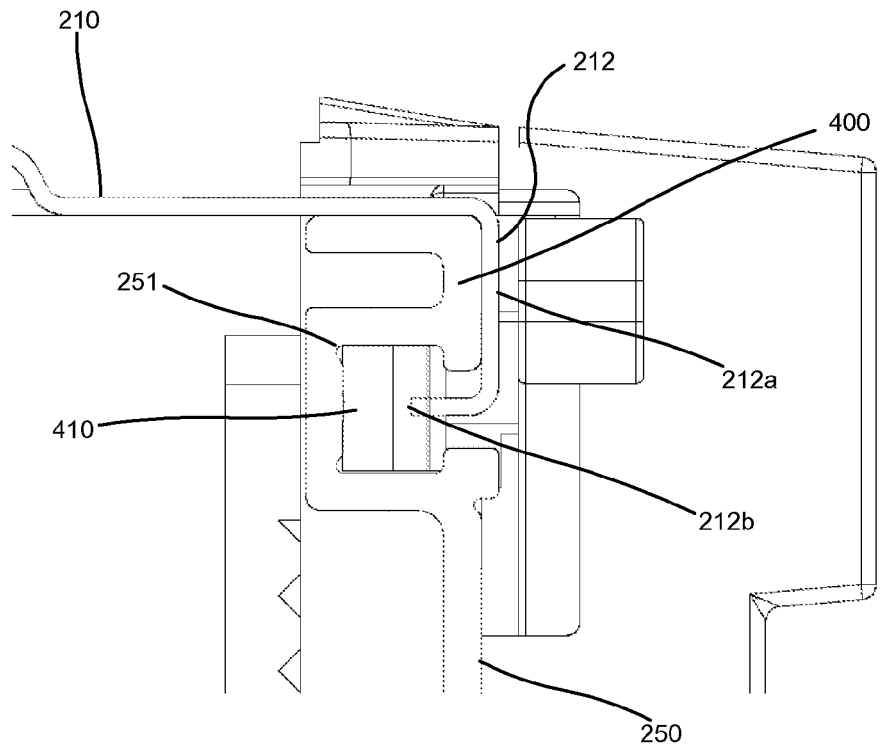
FIG. 7c is a detail view of a part of the top and rear panels of FIG. 7b.
Figure 7D:
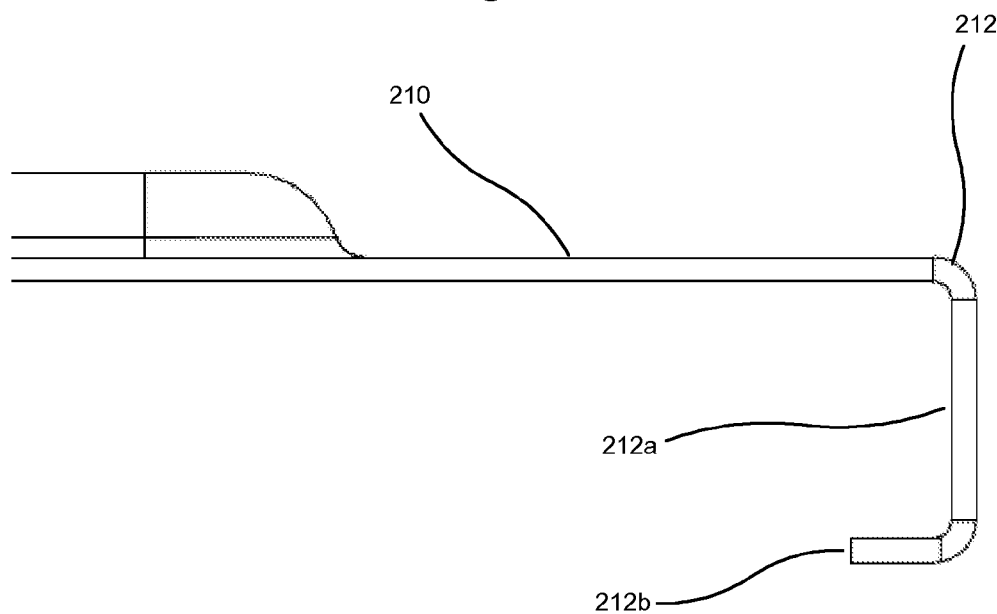
FIG. 7d is an isolated detail view of a part of the top panel of FIG. 7a as seen from I along the section J.

As is clearest shown in FIG. 7d, the rear edge 212 of the top plate 210 is provided with a U-shaped projection 212a which is terminated in an edge 212b, which edge faces the front edge 211 of the top plate. As is most clearly illustrated in FIG. 7c, the edge 212b of the projection is arranged to be inserted into a groove 251 in the rear panel 250, which groove is open in a direction which is parallel to the direction of the opening of the corresponding groove 261 in the front panel 260 when the cover 200 is assembled. In the groove, there is an already inserted spring part 410 of the same type as in the groove 261, which is arranged to be compressed between an inner surface in the groove 251 and the edge 212b when the top plate is conveyed to assume the position illustrated in FIGS. 7a-7c.

In this case, the projections 432 of the spring part 410 are arranged so that they abut against the inner surface of the groove 251, and the edge 212b, which preferably is narrow as compared to the width in the press plane of the spring part 410, abuts against the respective outsides 441 of valleys 440.

Thereby, the corresponding good contacting prerequisites as described above arise.

Figure 8:
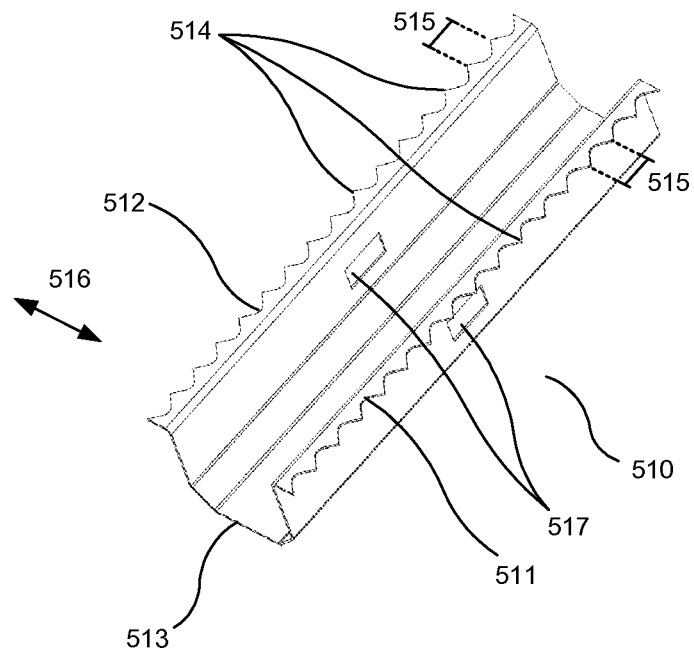
FIG. 8 is a perspective view of a third contacting device in the form of a spring.

FIG. 8 illustrates a third exemplifying embodiment of a contacting device in the form of a spring part 510, which preferably is used in connectors in which the joining together is arranged to be executed by an edge of the first panel being pushed up to and pressed against an edge of a second panel, in a direction perpendicular to the plane of the second panel, and to be locked into its position there, and where it is the respective short ends of the panels that are to be joined together. In the cover 200, there are such connectors 500, 600, arranged between on the one hand rear 250 and front 260 panels, and on the other hand the two side panels 230, 240.

The spring part 510, which is shaped as a plate spring arranged to be mounted in an orientation along the respective edges of the joined together panels, comprises a first edge 511, a second, opposite edge 512 and a curved, resilient blade 513 running between the two edges. Because of the resilient blade, the spring part can be compressed against a spring force 516 so that the two edges are pressed towards each other. In a joined together state in the connector in question, each edge is arranged to abut, and being pressed against the spring force, against a respective panel surface. The contact surface between each respective edge and the respective panel surface is limited to a plurality of pointed projections 514, arranged along each edge.

Thereby is achieved substantially the same advantages as with connectors comprising both the above described contacting devices 310, 410. Adequate electric contacting is achieved by the contact surfaces between the pointed projections 514 and the respective panel surfaces being small, in combination with that the spring force presses the spring part 510 against both panels. The shielding properties become reliable as a consequence of the periodically recurring points of contact, and can be adjusted by controlling the distances 515 between adjacent projections. Moreover, the advantage is achieved that the pointed projections can pierce any layers of lacquer or the like which are arranged on the respective panel surface, thereby creating good electric contacting even when such surface finish exists.

Figure 9:
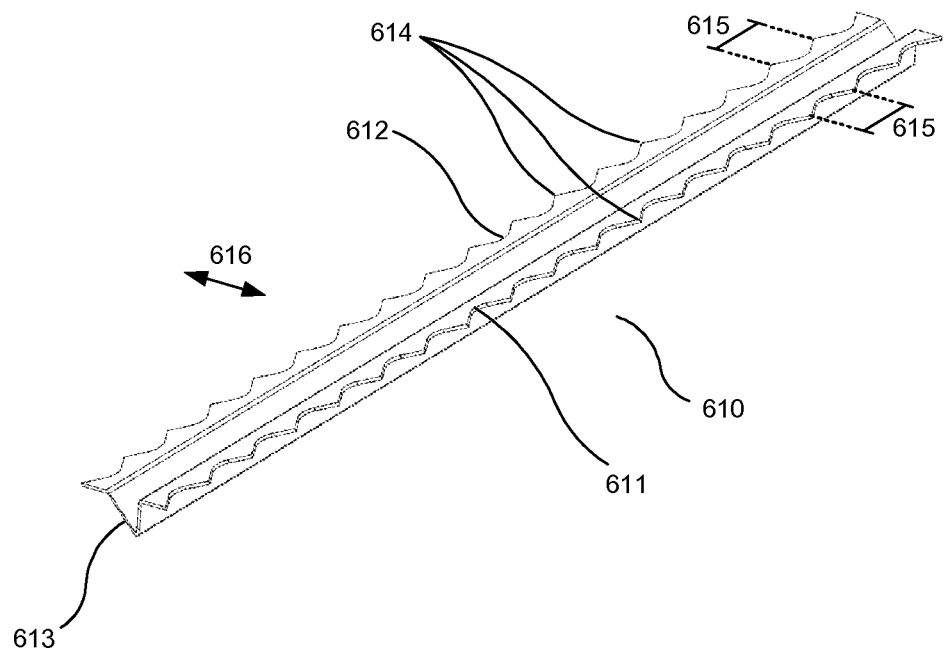
FIG. 9 is a perspective view of a fourth contacting device in the form of a spring.

FIG. 9 illustrates a fourth exemplifying embodiment of a contacting device comprising a plate spring part 610 similar to the spring part 510 illustrated in FIG. 8. The spring part comprises a first 611 and a second 612 side, and a blade part 613 running there between which gives rise to a spring force 616 when the spring is compressed, so that the sides are brought towards each other. A plurality of pointed projections 614 are arranged distanced by a distance 615 from each other along both edges.

As regards the contacting devices 510 and 610, it is preferred that the pointed projections 514, 614 are equidistantly arranged along the whole respective spring part. This results in good and easily controllable shielding properties.

According to a preferred embodiment, a connector comprising a plate spring 510, 610 also comprises a distance element, arranged to be arranged in the connector between the two panel elements, so that these are separated by the distance element, and so that the plate spring part 510, 610 runs from one of the panel element to the other, past the distance element. Furthermore, it is preferred that the distance element in this case comprises a through hole for a screw joint or the corresponding, by the use of which both panel elements can be pulled together and thereby be fixed in relation to each other.

Figure 10A:
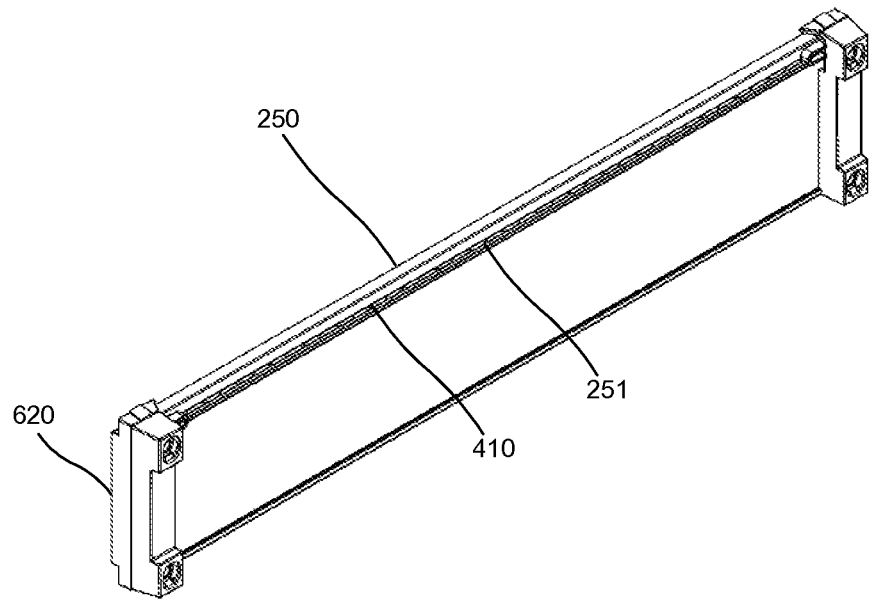
FIG. 10a is a perspective view of a rear panel.
Figure 10B:
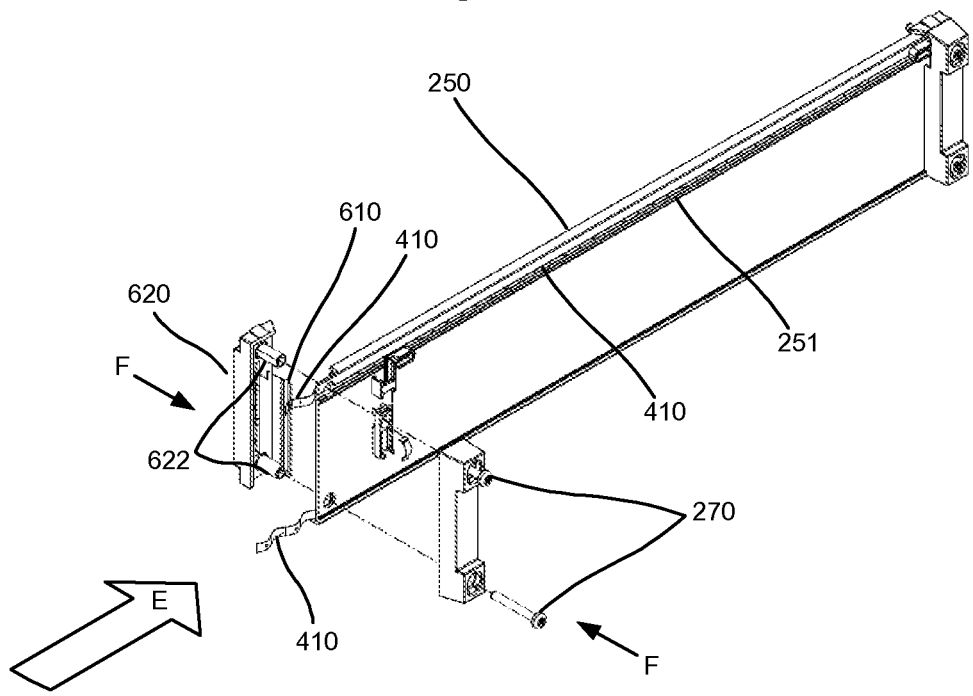
Figure 10C:
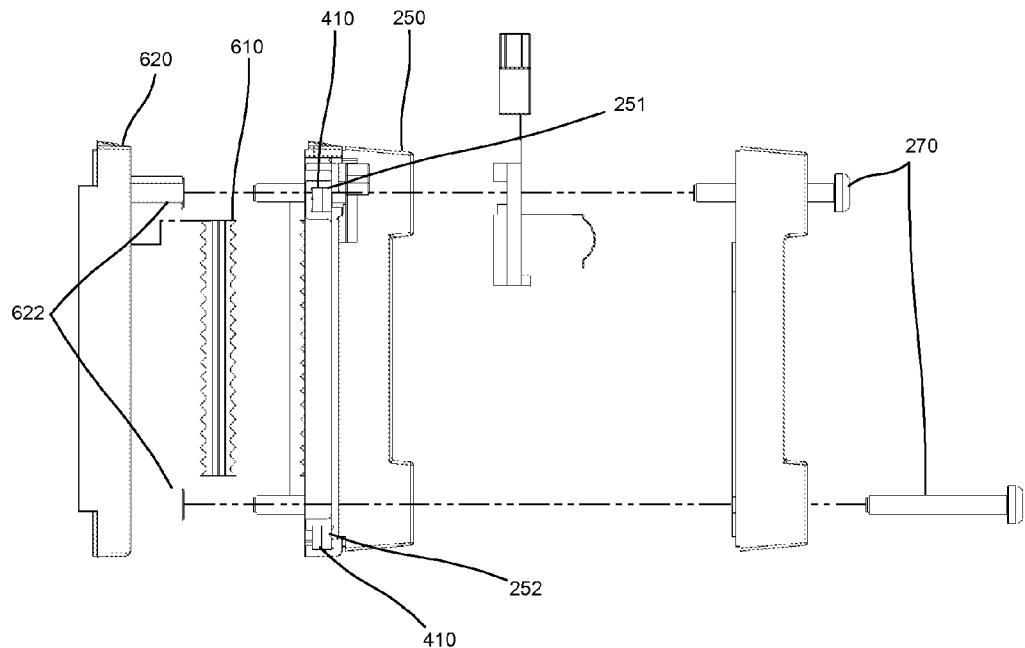
FIG. 10c is a cross-sectional view of the rear panel of FIG. 10b as seen from E along a section F.
Figure 10D:
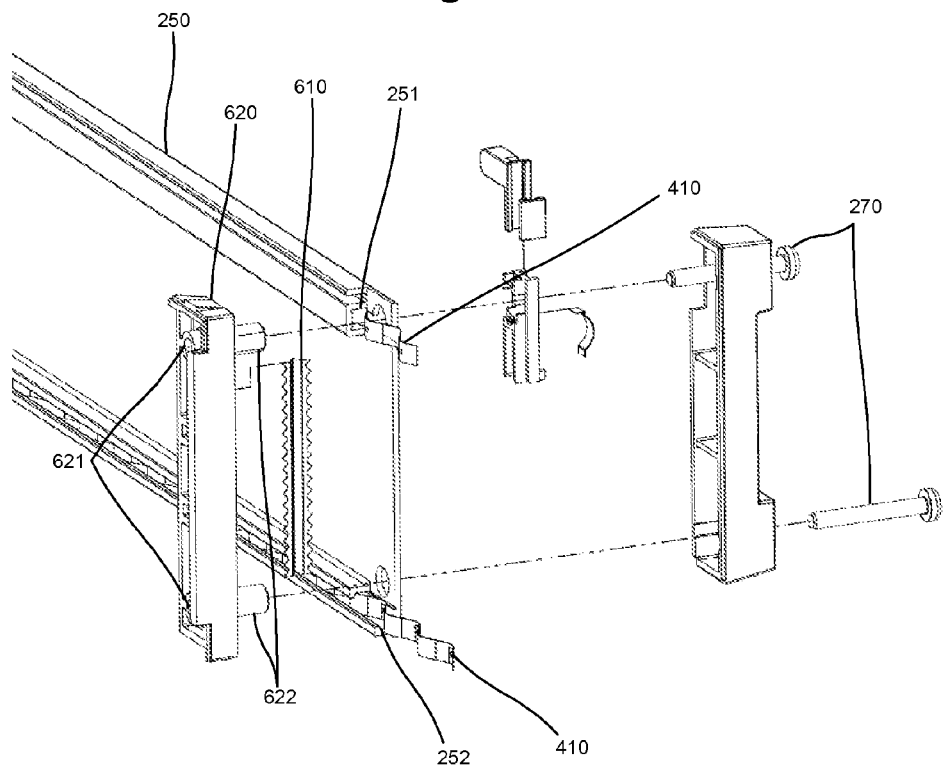
FIG. 10d is a detail perspective view of a part of the exploded rear part of FIG. 10b.
Figure 11A:
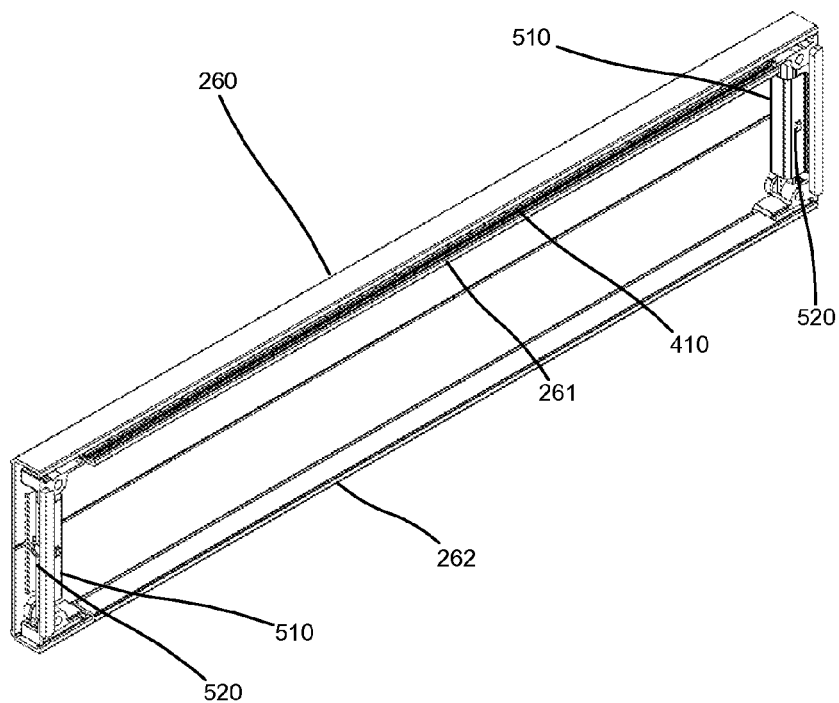
FIG. 11a is a perspective view of a front panel.
Figure 11C:
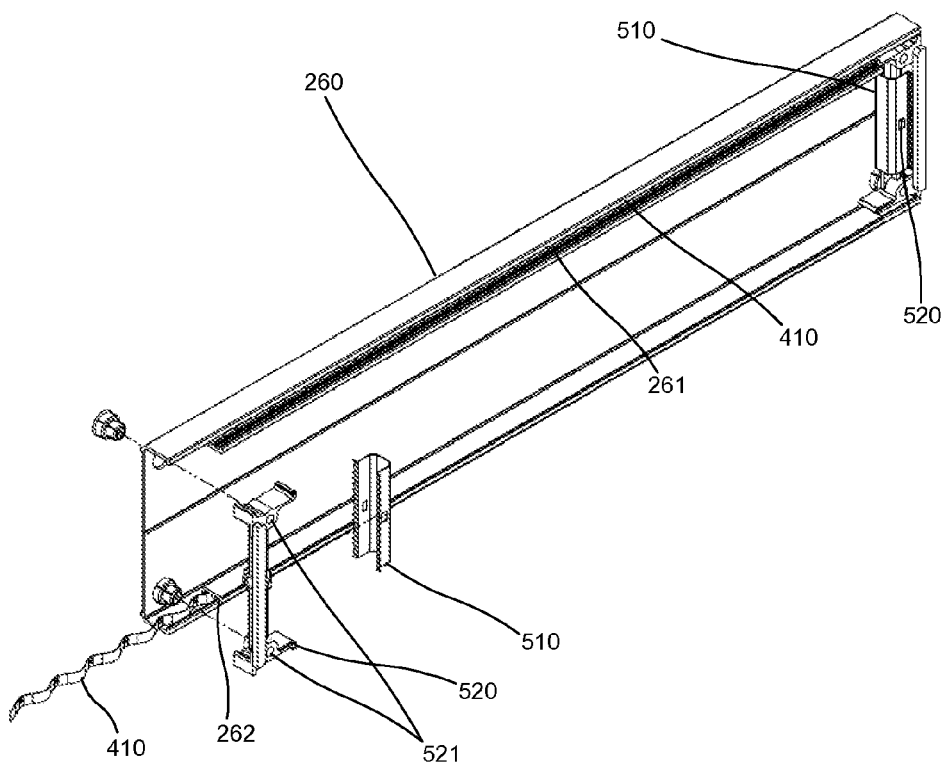
Figure 11D:
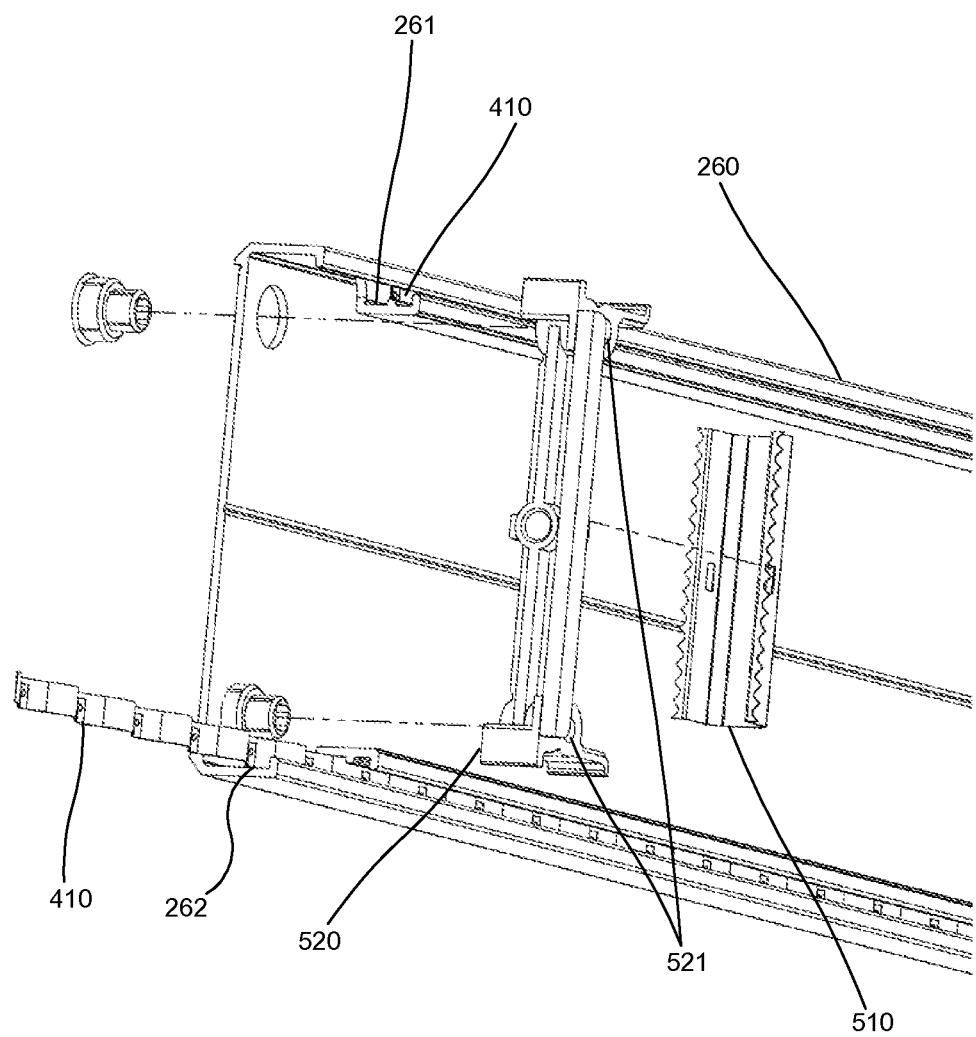
FIG. 11d is a detail perspective view of a part of the exploded front part of FIG. 11c.
Figure 12A:
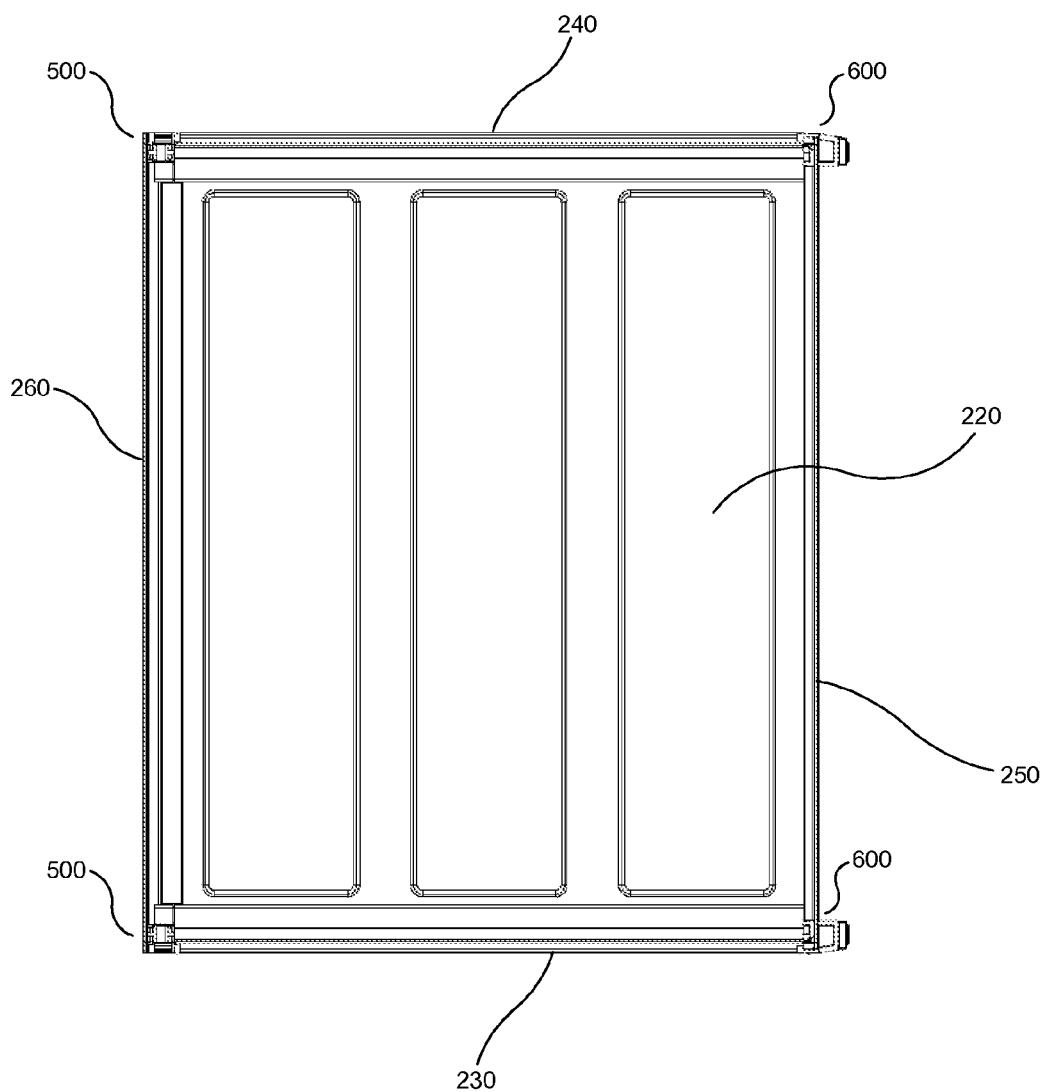
Figure 12B:
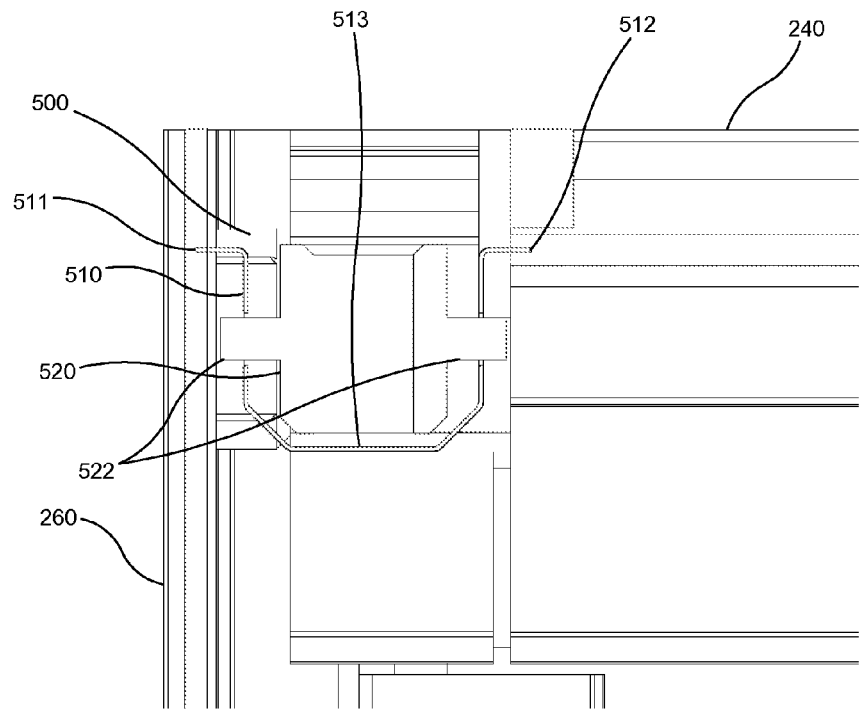
Figure 12C:
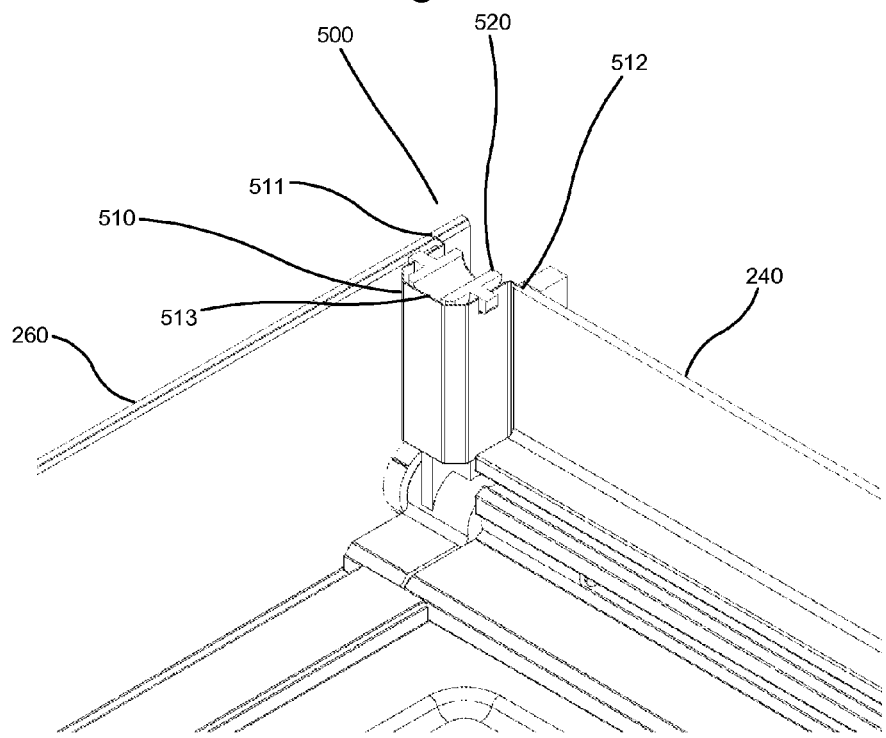
FIG. 12c is a perspective view of the cross-section of the cover as shown in FIG. 12b.
Figure 12D:
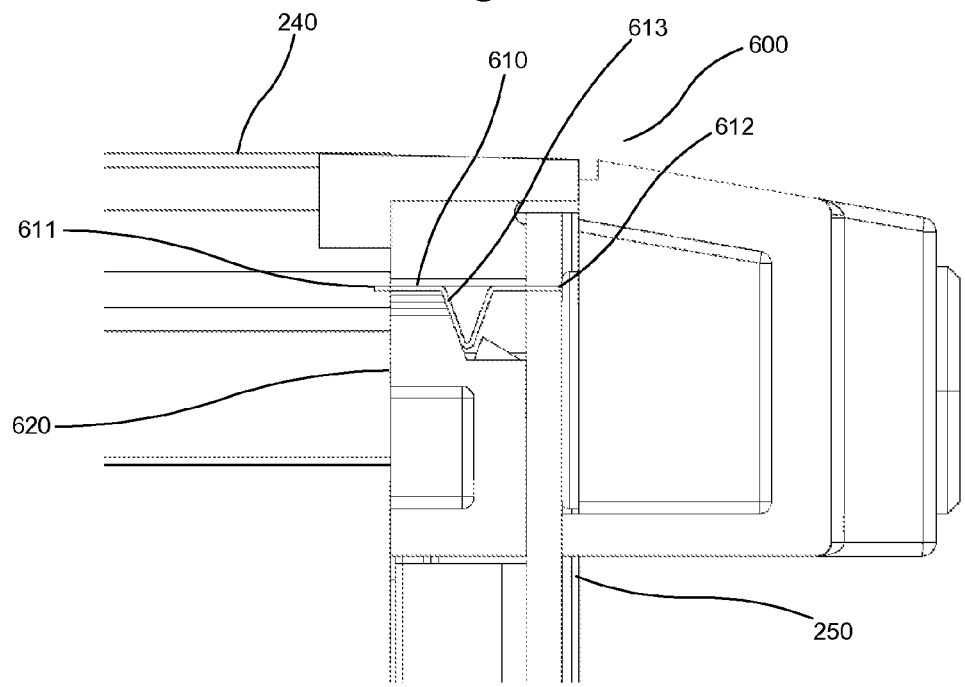
Figure 12E:
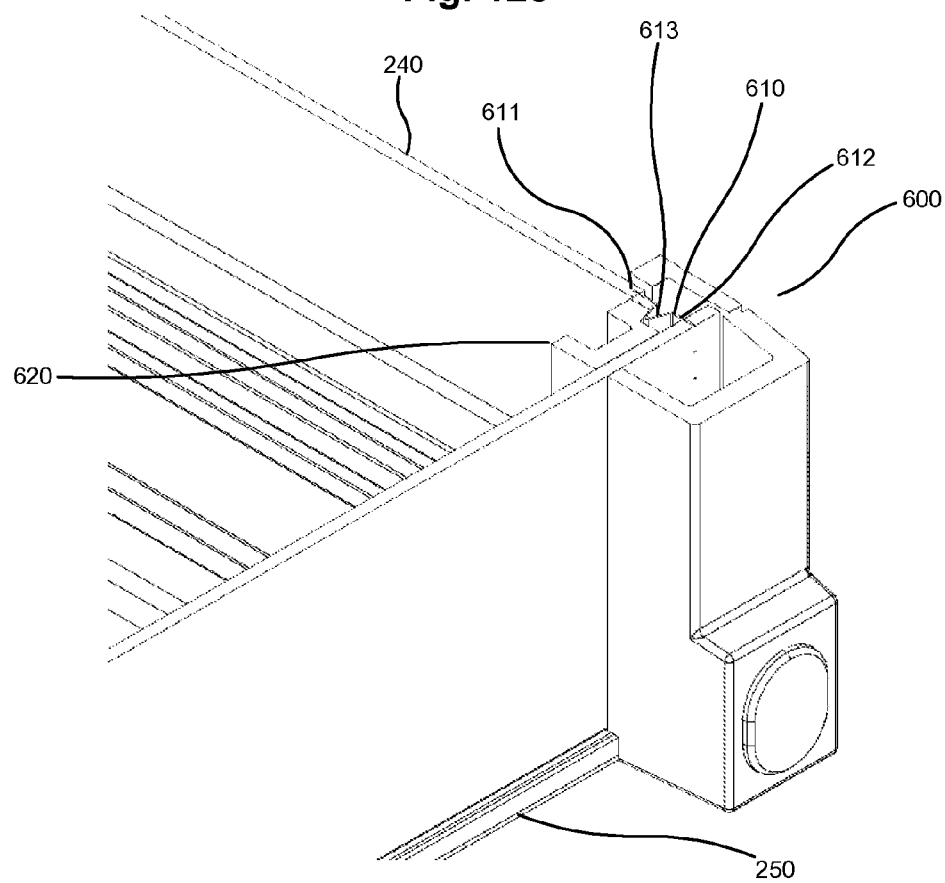
FIG. 12e is a perspective view of the cross-section of the cover as shown in FIG. 12d.

FIGS. 10-10d illustrate the rear panel 250 comprising among other things parts of the connector 600 between a surface of the rear panel and an edge of one 230 of the side panels. The connector 600 comprises a plate spring 610 of the fourth type described above, a distance means 620 as well as fastening screws 270 (not shown in FIG. 10a), arranged through two respective through holes 621 through the distance means. The fastening screws are arranged to fix the rear panel in relation to the side panel when joined together by the connector.

The plate spring 610 is arranged to run between rear panel and side panel, past the distance means, which comprises projections 522 arranged to abut against the rear panel so that a suitable distance between the rear panel surface and the side panel edge is achieved, which distance is selected so that the plate spring is compressed sufficiently between the panels, in an assembled state, so that the above described contacting advantages can be achieved.

FIGS. 11a-11d illustrate the front panel 260, comprising among other things parts of the connector 500 between a surface of the front panel and an edge of one 230 of the side panels. The connector 500 comprises a plate spring 510 of the third type described above, a distance means 520 as well as two fastening screws 270 (not shown in FIGS. 11a-11b) arranged through two respective through holes 521 through the distance means. The fastening screws are arranged to fix the front panel in relation to the side panel when they are joined together by the connector.

The plate spring 510 is arranged to run between front panel and side panel, past and around the distance means, which is dimensioned so that a suitable distance between the front panel surface and the side panel edge can be achieved, which distance is selected so that the plate spring is compressed sufficiently between the panels.

FIGS. 12a-12e illustrate in closer detail the connectors 500, 600, comprising plate springs of the above described third 510 and fourth 610 types. It is noted that FIGS. 12c and 12e, respectively, have been constructed by first cutting the cover 20 along the cross-section illustrated in FIG. 12a, thereafter removing the upper part of the cover and finally creating a perspective view showing the thus remaining, lower part.

As is clear primarily from FIGS. 12b-12e, the respective edges 511, 512, 611, 612 of both plate spring parts 510, 610 abut against on the one hand a side surface of the front panel 260 and the rear panel, respectively, and on the other hand an edge surface of the respective side panel 240, 230. Such a configuration with contacting against side surface and edge surface, respectively, results in an uncomplicated construction, but is not necessary to achieve good contacting between the two panels. It is also noted that the plate spring part 510 is arranged to run around its respective distance means 520 in the connector, while the plate spring part 610 is arranged to run essentially next to its respective distance means 620 in the connector. In the first mentioned case, the plate spring part 510 comprises alignment holes 517 (see FIG. 8), arranged to engage with corresponding alignment means 522 in the distance means 520 in order to retain the plate spring 510 in the correct position in the connector 500.

Figure 13C:
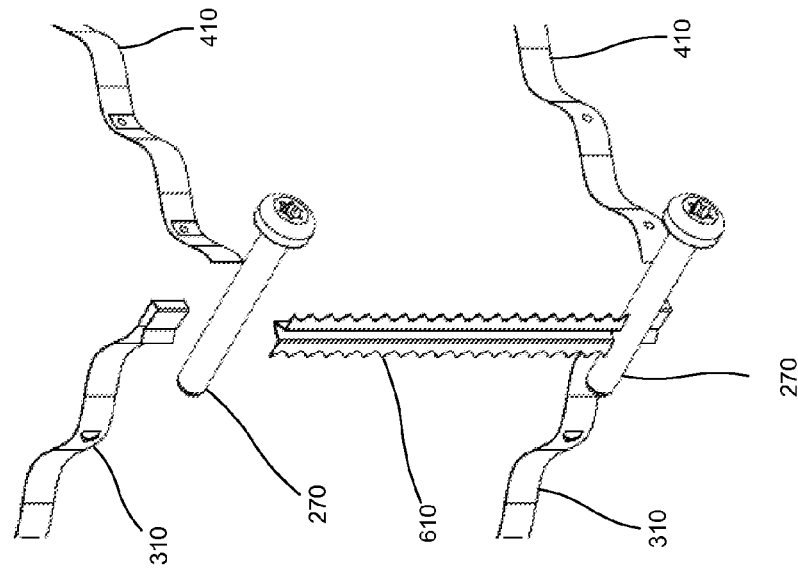
Figure 13B:
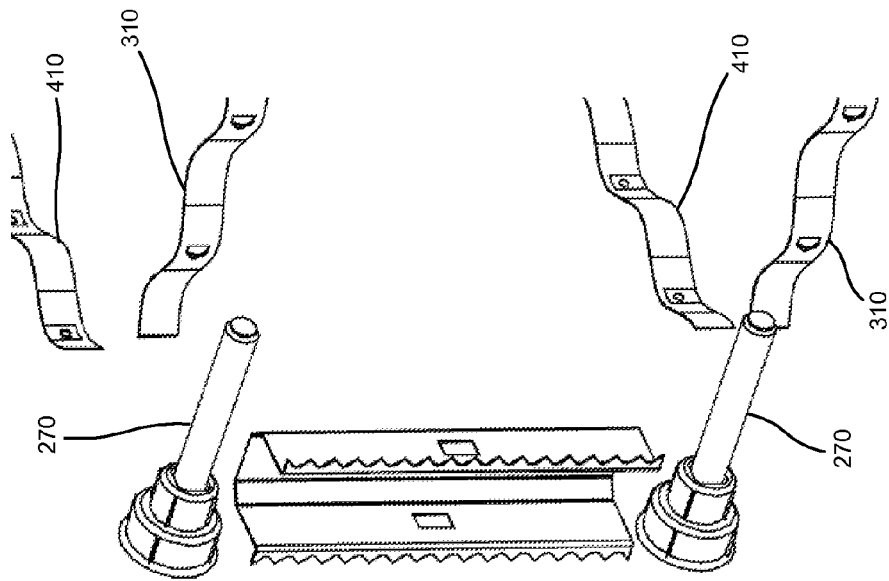

FIGS. 13a-13c illustrate the above described contacting devices 310, 410, 510, 610 and the fastening screws 270, in isolation from the other parts of the cover 200 and as they are arranged in relation to each other in the cover when it is in its assembled state.

According to a preferred embodiment, illustrated in FIG. 13a, each connector between each pair of adjacent panels comprises a contacting device of the first, second, third or fourth type as described above. In other words, all neighboring panels are arranged to be movable in relation to each other but connectable and thereby fixable in relation to each other using said connector comprising resilient contacting devices. Also, each individual contacting devices extends along at least half of the joint between the joined together panel elements, more preferably along the whole joint except along a part of the joint near the end of the connector, where the panels are joined together in another way than using a spring part, such as for example using a bolted joint comprising a screw 270, preferably a single bolted joint. Most preferably, the contacting device extends along essentially the whole of the joint.

Furthermore, it is preferred that, for the spring part of each individual contacting device, the largest distance between two adjacent points of contact, between a certain spring part and a panel associated with the spring part, nowhere is larger than 20 mm. For a spring part of the first or second type, this means that the maximum distance between two consecutive crests and valleys, respectively, is maximally 20 mm for all crests and all valleys.

In case the contacting device extends along essentially the whole joint, it is also preferred that the part which possibly is not covered by the contacting device is arranged at one or both of the ends of the connector, and that such a part is not more than 20 mm of length. In case the contacting device extends along the whole joint except for a part near the end of the connector, it is preferred that the distance between the additional connection point arranged in the end and contacting device is not more than 20 mm.

Furthermore, and according to the preferred embodiment illustrated in FIGS. 13a-13c, the various panels in the cover are formed as rectangles, and all connectors 290, 291, 292, 293, 300, 400 which are arranged along at least one edge of a panel comprising a long edge of the panel in question comprise a wave-shaped spring part 330, 410, comprising a plurality of alternating crests and valleys. It is also preferred that at least two of these wave-shaped spring parts 320 are of the above described first type, that is a hook spring part 310. In this latter case, at least two of these hook spring parts 310 are arranged in parallel. This results in that a top panel 210 and/or a bottom panel 220 can be pushed in between two side panels 230, 240 as described above, thus easily and quickly yet with good contact sealing the cover 200 in a reopenable fashion.

It is especially preferred that the cover 200 is assembled by all other constituting panels 220, 230, 240, 250, 260 firstly being joined together in the above described way, and that the top panel 210, in the form of a top plate, thereafter is pushed in, with its front edge 211 first, as a result of the top panel 210 side edges 213, 214 being guided in the grooves 231, 241 arranged in the adjacent side panels 230, 240, so that a closed cover 200 is thus established. In this case, it is also preferred that the top plate comprises the U-shaped projection 212a.

Moreover, it is preferred that all connectors 500, 600 which are arranged along two short edges of the panels joined together by the connector in question are contacting devices of the above described third or fourth types, comprising a spring part 510, 610 of plate spring type, in turn comprising a plurality of pointed projections. This will result in that these connectors, which are comparatively shorter than the other connectors in the cover 200, can be guaranteed sufficient contacting using a relatively uncomplicated construction.

All the above described components are preferably of metal, in order to maximize the contacting between the parts.

According to a preferred embodiment, all panels in the cover 200 are made from aluminum, which gives good shielding properties. It is especially preferred that each panel 230, 240, 250, 260 comprising an open channel 231, 232, 241, 242, 251, 252, 261, 262 for a wave-shaped spring 320, 410 is made as an aluminum profile with constant cross-section. This results in a simple, cheap yet robust construction with good shielding properties.

Those panels 210, 220 comprising edges arranged to be pushed in towards contacting devices of the above described second type, comprising a wave spring part 410, perpendicularly to the press plane of the spring part 410, are preferably made from pressed sheet metal. Such sheet metal can for example be surface dressed with lacquer or the like in a first step, and thereafter be contour punched to the right shape. This way, the edge surfaces of the sheet metal can be arranged to expose a metal surface, and the contacting between the edge surface and spring part is maximized.

As regards spring parts 320, 410, 510, 610 and screws 270, it is preferred that these are made from metal, resulting in good electric conductivity properties, preferably stainless steel. Spring parts 320, 410, 510, 610 are preferably made from spring steel. Screws 270 are preferably self-tapping, which gives very good contacting to the material in which each screw is tapped and therefore cuts into.

A cover according to the present invention thus yields efficient and well-controlled shielding of electromagnetic disturbance across a broad spectrum of disturbing frequencies. Furthermore, this is accomplished at a relatively low cost, and in a way admitting simple assembling, disassembling, opening and closing. Moreover, the shielding properties can be controlled by replacing the constituting spring elements to new spring elements with smaller or larger distances between the points of abutment against the panels.

Above, exemplifying embodiments have been described. However, it is apparent to the skilled person that many modifications may be made to the described embodiments without departing from the idea of the invention.

For example, the cover can assume other geometric shapes using the above described contact principles. For example, the cover can be shaped as a rectangular parallelepiped, the height of which is larger than the sides of its basis surface, or having partly open sides. Other geometric shapes than a rectangular parallelepiped can of course also be used. Alternatively, the cover can be designed with fewer than six in relation to each other movable panels, so long as at least one panel is arranged to be joined together with the rest of the parts in the cover using contacting devices according to the above said. Finally, other types of contacting devices can be used in combination with the herein described contacting devices.

Thus, the invention shall not be limited to the described embodiments, but can be varied within the frame of the enclosed claims.

The invention claimed is:

1. Cover (200) for electronic equipment comprising at least two in relation to each other movable metal panel elements (210,220,230,240,250,260), wherein the panel elements are arranged to be joined together along respective edges of the panel elements, so that they in a joined together and in relation to each other immobile state form the cover, wherein the cover comprises a respective connector (290,291,292,300, 400,500,600) for mechanical joining and good electric contacting along each one of the edges along which the panel elements are arranged to be joined together, wherein each connector comprises a respective resilient metal contacting device (310,410,510,610), which contacting device is arranged between the respectively joined together panel elements and in direct contact with both panel elements when the panel elements are in the joined together state, and thereby is compressed against the spring force (362,462,516,616) of the contacting device, so that the spring force acts against the surfaces of both the respective joined together panel elements and connects them to each other electrically, wherein at least one contacting device (510,610) is caused to comprise an elongated compression spring part of plate spring type comprising a first edge (511,611), a second edge (512,612) and a curved, resilient blade (513, 613) running between the two edges, wherein the contact surface between the compression spring part and both respective panel elements is limited to a plurality of pointed projections (514,614) on the compression spring part, and in that the said at least one contacting device also comprises a distance element (520,602), which is separate from the compression spring part and adapted for being arranged between the two panel elements so that these are separated by the distance element, as well as a jointing (270), arranged to pull the two panel elements together.

2. Cover (200) according to claim 1, wherein the respective edges (511,512;611,612) of the compression spring part are arranged to, when in the joined together state, abut, and against the spring force press, against one respective panel element (230,240,250,260) each, and in that the pointed projections (514,614) are arranged along the respective edge.

3. Cover (200) according to claim 1, wherein all connectors between each pair of panel elements (210,220,230,240,250, 260) are designed with respective contacting devices (310, 410,510,610) extending along the whole length of a joint between the respective panel elements in the joined together state.

4. Cover (200) according claim 1, wherein, in the joined together state, the largest distance between two adjacent points of contact, between a certain contacting device (310, 410,510,610) and a panel element (210,220,230,240,250,260) associated with the contacting device, nowhere along the contacting device is larger than 20 mm.

5. Cover (200) according to claim 1, wherein at least one contacting device (310,410) comprises an elongated, wave-shaped compression spring part (320,410), comprising a plurality of alternating crests (330,430) and valleys (340,440), so that the wave-shaped spring part is arranged to be compressed between the panel elements, when the two respective panel elements (210,220,230,240,250,260) are joined together and against the spring force (362,462) in a press plane which is perpendicular to the direction of the spring force, whereby the outsides (331,431) of the crests are pressed against the first panel element (230,240,250,260) and the outsides (341,441) of the valleys are pressed against the other panel element.

6. Cover (200) according to claim 5, wherein at least one end (370,470,471) of the spring part (320,410) is free, whereby the spring part under the pressure from the pressed together panel elements (210,220,230,240,250,260) is arranged to be flattened and thereby extended.

7. Cover (200) according to claim 5, wherein the surface of the wave-shaped spring part (320,410) which is arranged to face the first panel element (230,240,250,260) in the joined together state is arranged with projections (332,432) arranged at the respective crests (330,430).

8. Cover (200) according to claim 7, wherein the projections (332) are designed with relatively low sliding friction against the first panel element (230,240,250,260) during sliding of the spring part (320) in the direction of motion (361) and relatively high sliding friction against the first panel element during sliding of the spring part in the opposite direction, and in that the contacting device (310) also comprises a hook part (311), arranged to grip around an edge (231a,232a) of the first panel element.

9. Cover (200) according to claim 7, wherein the projections (432) are shaped as part spheres.

10. Cover (200) according to claim 5, wherein the cover comprises panel elements (210,220) in the form of a top plate and/or a bottom plate, in that the cover is assembled by first joining together the rest of the constituting panel elements (230,240,250,260) and thereafter pushing in the plate, with a first edge (211) first, by allowing the side edges (213,214) of the plate be guided in grooves (231,232,241,242), arranged for this purpose in adjacent panel elements (230,240) so that a closed cover is thus formed, wherein a second edge (212), arranged on the opposite side in relation to the first edge of the plate is arranged with a U-shaped projection (212*a*) which is terminated in an edge (212*b*), the edge of which U-shaped projection faces the first edge (211), and the edge of which projection is arranged to be joined together with another panel element (250) using a connector (400) comprising a wave-shaped spring (410), whereby the edge of the projection is arranged to be pressed against the wave-shaped spring in the direction of motion of the plate when the plate is brought to its final position in which the closed cover is formed.

11. Cover (200) according to claim 5, wherein all connectors (290,291,292,293,300,400) that are arranged along at least one edge of a panel element (210,220,230,240,250,260) that constitutes a long edge of the panel element in question are in the form of a wave-shaped spring part (320,310) comprising a plurality of alternating crests (330,430) and valleys (340,440).

12. Cover (200) according to claim 1, wherein the spring part of plate spring type runs from one of the panel elements (230,240,250,260) to the other, past the distance element (520,620), and in that the distance element comprises a through hole (521,621) for the jointing (270).

13. Cover (200) according to claim 1, wherein all connectors (500,600) that are arranged along two short edges of the joined together panel elements (230,240,250,260) are comprised by a spring part (510,610) of plate spring type, comprising a plurality of pointed projections (514,614).

14. Cover (200) according to claim 1, wherein the distance element (520) is arranged to maintain the contacting device (510) in its correct position in relation to the connector (500).

\* \* \* \* \*

UNITED STATES PATENT AND TRADEMARK OFFICE
CERTIFICATE OF CORRECTION

PATENT NO. : 8,610,002 B2  Page 1 of 1
APPLICATION NO. : 13/503375
DATED : December 17, 2013
INVENTOR(S) : Bertil Lohman It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 57 days.

Signed and Sealed this

Twenty-second Day of September, 2015

Michelle K. Lee
*Director of the United States Patent and Trademark Office*